US00RE48929E

(19) United States
(12) Reissued Patent
Tomoda et al.

(10) Patent Number: US RE48,929 E
(45) Date of Reissued Patent: Feb. 15, 2022

(54) DISPLAY DEVICE

(71) Applicant: SONY SEMICONDUCTOR SOLUTIONS CORPORATION, Kanagawa (JP)

(72) Inventors: Katsuhiro Tomoda, Kanagawa (JP); Toshiya Takagishi, Kanagawa (JP); Izushi Kobayashi, Tokyo (JP); Masaru Fujii, Kanagawa (JP); Hiroshi Terahara, Kagoshima (JP); Masato Doi, Kanagawa (JP); Hisashi Kadota, Kanagawa (JP)

(73) Assignee: SONY SEMICONDUCTOR SOLUTIONS CORPORATION, Kanagawa (JP)

(21) Appl. No.: 15/883,950

(22) Filed: Jan. 30, 2018

Related U.S. Patent Documents

Reissue of:
(64) Patent No.: 9,250,456
Issued: Feb. 2, 2016
Appl. No.: 14/226,903
Filed: Mar. 27, 2014

(30) Foreign Application Priority Data

Mar. 27, 2013 (JP) ..... 2013-066587

(51) Int. Cl.
*G02F 1/133* (2006.01)

(52) U.S. Cl.
CPC ..... *G02F 1/133* (2013.01); *G02F 2201/14* (2013.01); *H01L 2924/0002* (2013.01)

(58) Field of Classification Search
CPC ..... G02F 1/09; G02F 1/133; G02F 2201/14; H01L 2924/0002; H01L 27/323
USPC ..... 313/498; 438/70; 257/40; 359/280
See application file for complete search history.

(56) References Cited

U.S. PATENT DOCUMENTS 8,262,271 B2 * 9/2012 Tillin ..... G02B 27/0101 362/606
9,213,188 B2 * 12/2015 Yang ..... G02B 27/2214
2008/0198439 A1 * 8/2008 Cho ..... B82Y 20/00 359/280
2009/0091238 A1 * 4/2009 Cok ..... H01L 27/322 313/498
2009/0141217 A1 * 6/2009 Lim ..... G02F 1/133555 349/99

(Continued)

FOREIGN PATENT DOCUMENTS

JP 2010-092666 4/2010

*Primary Examiner* — Tuan H Nguyen
(74) *Attorney, Agent, or Firm* — Chip Law Group

(57) ABSTRACT

A display device includes a first substrate, a second substrate, and a plurality of light emitting sections. The first substrate includes a first surface and a second surface which faces the first surface. The second substrate is arranged to face the first substrate, and is configured with a first surface which faces the second surface of the first substrate, and a second surface which faces the first surface. The plurality of light emitting sections is provided on the second surface of the first substrate while being separated from the second substrate. A light transmission suppression layer on which a light transmission section to transmit light from light emitting sections is provided is formed on the second surface of the second substrate in correspondence to each light emitting section. An anti-reflection layer is formed in the light transmission section.

28 Claims, 20 Drawing Sheets

(56) References Cited

U.S. PATENT DOCUMENTS

| | | | | |
|---|---|---|---|---|
| 2012/0206325 | A1* | 8/2012 | Yamazaki | G09G 3/003 345/87 |
| 2014/0117324 | A1* | 5/2014 | Kim | H01L 27/323 257/40 |
| 2014/0374704 | A1* | 12/2014 | Jang et al. | 257/40 |

* cited by examiner

DISPLAY DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

This application *is a reissue application of U.S. patent application Ser. No. 14/226,903, filed Mar. 27, 2014, which* claims the benefit of Japanese Priority Patent Application JP 2013-066587 filed Mar. 27, 2013, the entire contents of which are incorporated herein by reference.

BACKGROUND

The present disclosure relates to a display device.

In display device, it is extremely important to reduce the specular reflectance of an image display section from displayed a viewpoint of improving the contrast and the quality of image. As a technology for reducing the specular reflectance of an image display section, a method of forming a dielectric multilayer film on the surface of the image display section or a method of forming an anti-reflection film or a low-reflection film thereon has been known. In addition, a technology for affixing a moth-eye film on the surface of an image display section is widely known from, for example, Japanese Unexamined Patent Application Publication No. 2010-092666.

SUMMARY

Meanwhile, in a dielectric multilayer film, an anti-reflection film, and a low-reflection film according to the related art, specular reflectance is about 1%, and thus it is difficult to say that the glare of the image display section is sufficiently prevented. In addition, in a tiling-type display device in which a plurality of display devices (for convenience, referred to as "display device units") is arranged, it is difficult to accomplish high smoothness of the surfaces of the image display sections of the entire display device when the display device units are placed. Further, if some of the display device units are, for example, tilted, the light reflection states of the display device units differ from the light reflection state of other display device units, and thus the tilted display device units are noticeable. It is possible to accomplish low reflectance using the moth-eye film. However, if the moth-eye film is polluted, variation in light reflectance is generated. That is, the moth-eye film is low in durability.

In addition, although depending on the type of the display device, if patterns, pictures, or letters are drawn in the image display section when the display device does not display an image, that is, when the display device does not operate, it is possible to improve a kind of visual effect of the entire display device.

Therefore, first, it is desirable to provide a display device that includes a configuration and a structure which include high durability and which can accomplish sufficient low reflectance. In addition, second, it is desirable to provide a display device that includes a configuration and a structure in which patterns are visible or the like when the display device does not display an image.

According to a first embodiment or a second embodiment of the present disclosure, there is provided a display device including: a first substrate that includes a first surface and a second surface which faces the first surface; a second substrate that is arranged to face the first substrate, and that is configured with a first surface which faces the second surface of the first substrate, and a second surface which faces the first surface; and a plurality of light emitting sections that is provided on the second surface of the first substrate while being separated from the second substrate.

Further, in the display device of the first embodiment of the present disclosure, a light transmission suppression layer on which a light transmission section to transmit light from light emitting sections is provided is formed on the second surface of the second substrate in correspondence to each light emitting section, and an anti-reflection layer is formed in the light transmission section.

In addition, in the display device of the second embodiment of the present disclosure, a light transmission suppression layer, provided with a first light transmission section which transmits light from light emitting sections, is formed on the second surface of the second substrate in correspondence to each light emitting section, and a light non-transmission section layer, provided with a second light transmission section which transmits light from the light emitting section, is formed on the first surface side of the second substrate, and an area of the second light transmission section is smaller than an area of the first light transmission section. Also, the light non-transmission section layer is formed on the first surface side of the second substrate. However, more specifically, the light non-transmission section layer may be formed on the first surface of the second substrate, and may be formed in an area between the light emitting section and the first surface of the second substrate. The facts are the same in the description below.

In the display device according to the first embodiment of the present disclosure, the light transmission suppression layer, provided with the light transmission section which transmits light from the light emitting section, is formed on the second surface of the second substrate and the anti-reflection layer is formed on the light transmission section in correspondence to each light emitting section. In addition, in the display device according to the second embodiment of the present disclosure, the light transmission suppression layer, provided with the first light transmission section which transmits light from the light emitting section, is formed on the second surface of the second substrate and the light non-transmission section layer, provided with the second light transmission section which transmits light from the light emitting section, is formed on the first surface side of the second substrate in correspondence to each light emitting section. Further, the area of the second light transmission section is smaller than the area of the first light transmission section. Therefore, it is possible to provide a display device which includes high durability and which can accomplish sufficient low reflectance, and a display device which can view patterns or the like when the display device does not display an image.

DETAILED DESCRIPTION OF EMBODIMENTS

Figure 1A:
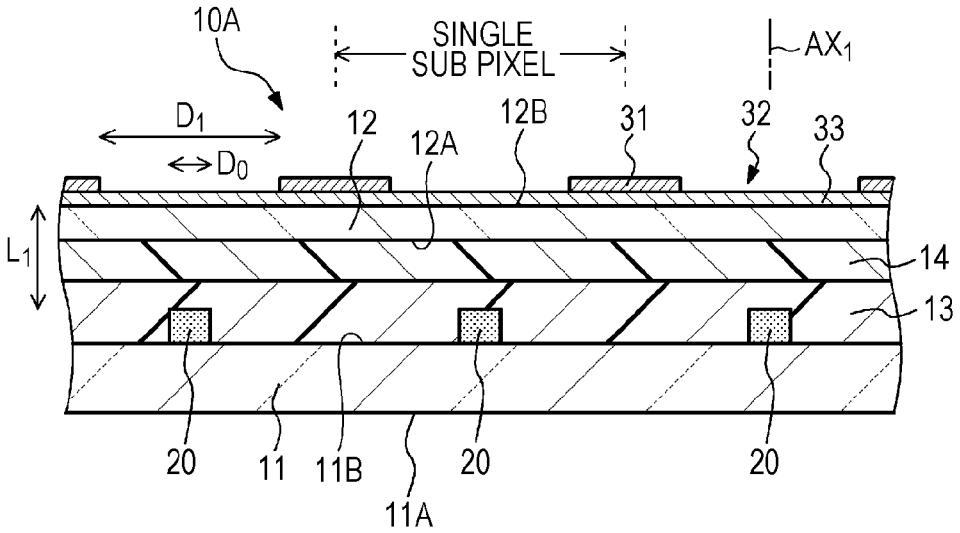
FIGS. 1A and 1B are a partial schematic sectional view and a partial schematic plan view illustrating a display device according to a first example.

Hereinafter, although the present disclosure will be described based on examples with reference to the accompanying drawings, the present disclosure is not limited to the examples and various numerical values and materials in the examples are examples. Also, description will be performed in the following order:

1. Description related to entire display device according to first and second embodiments of the present disclosure
2. First example (Display device according to first embodiment of the present disclosure)
3. Second example (Display device according to second embodiment of the present disclosure)
4. Third example (Modification of first example that is combined with display device according to second example)
5. Fourth example (Modification of first to third examples)
6. Fifth example (Modification of first to fourth examples
7. Sixth example (Display device according to third embodiment)
8. Seventh example (Display device according to fourth embodiment), and others Description related to entire display device according to first and second embodiments of the present disclosure In a display device according to a first embodiment of the present disclosure, it is possible for a light transmission suppression layer to have an anti-reflection function, and thus it is possible to accomplish a first advantage according to first and second embodiments of the present disclosure. Further, in this case, it is preferable that the light transmission suppression layer have specular reflectance at the same level as the specular reflectance of an anti-reflection layer. Here, although the "same level" is not limited, "the same level" means that a condition ≤(the specular reflectance of the light transmission suppression layer/the specular reflectance of the anti-reflection layer)≤2 is satisfied. Generally, the magnitude of scattering reflectance on the surface of the display device determines the black level depression when an image is displayed. On the other hand, the magnitude of specular reflectance on the surface of the display device determines the brightness of an image which is reflected in the surface of the display device and has a great influence on the quality of the image which is displayed. In the display device according to the first embodiment of the present disclosure, the specular reflectance is defined as described above, and thus it is possible to accomplish high image display quality. For example, if frosted printing is performed, the specular reflectance is reduced. However, a value of the scattering reflectance increases, and thus it is difficult to take appropriate balance between the specular reflectance and the scattering reflectance. In addition, in AG coating in which fine particles are used, there is a problem in that pseudo deduction of a light emitting section is generated.

In the display device according to the first embodiment of the present disclosure which includes the above-described preferable configuration, a configuration can be made such that the anti-reflection layer extend between the light transmission suppression layer and the second surface of a second substrate and that the anti-reflection layer can cover the light transmission suppression layer in order to accomplish the first advantage according to the embodiment of the present disclosure.

Otherwise, in the display device according to the first and second embodiments of the present disclosure, a configuration can be made such that a pattern is attached to the light transmission suppression layer in order to accomplish the second advantage according to the embodiment of the present disclosure. Further, in this case, a configuration can be made such that a pattern formation pitch is set to the integer multiple, the equivalent multiple, or the integer fraction of a light emitting section arrangement pitch. Therefore, the boundary region between a pixel (or a sub-pixel) which is configured with a light emitting section and a pixel (or a sub-pixel) which is adjacent to the pixel (or a sub-pixel) is obscure. Further, if a tiling-type display device is used as the display device as described above, it is possible to cause the boundary region between a display device (display device unit), which configures the tiling-type display device, and a display device unit to be obscure.

In the display device according to the first and second embodiments of the present disclosure which includes the above-described preferable configuration, it is preferable that a configuration be made such that the thickness of the light transmission suppression layer becomes thin as being close to the light transmission section (first light transmission section) in order to accomplish further wider view angle. The change in the thickness of the light transmission suppression layer may be a linear-shaped change, a smooth curved change, or a stepped change.

Further, in the display device according to the first and second embodiments of the present disclosure which includes the above-described preferable configuration, when it is assumed that the external shape of the light transmission section (first light transmission section) is a circle which has a diameter $D_1$, that the light emitting section is a circle which has a diameter $D_0$, that a distance from the top face of the light emitting section to the light transmission section (first light transmission section) is $L_1$, and that the average refractive index of a light path from the light emitting section to the light transmission suppression layer, provided with the light transmission section, is $n_1$, it is preferable that $\tan(\sin^{-1}(1/n_1)) \leq (D_1-D_0)/(2\cdot L_1) \leq 2$ is satisfied. Also, generally, $n_1$ is a value in the range of 1.4 to 1.6, and $\tan(\sin^{-1}(1/n_1))$ is generally a value included between 0.8 and 1.02. In this case, it is preferable that the center of the light emitting section and the center of the light transmission section (first light transmission section) be on the same axis line. Here, when the light emitting section is configured with a single light emitting element and the planar shape of the section of a single light emitting element which actually emits light is a circle, "assumption that the light emitting section is a circle which has a diameter $D_0$" means that the diameter of a section which actually emits light is $D_0$, and means that, when the section which actually emits light is not a circle, the diameter of a circle, acquired by converting the area of the section which actually emits light into an area of a circular, is $D_0$. On the other hand, as will be described later, when a single pixel of the light emitting element type-display device is configured with, for example, a group (light emitting unit) including a first light emitting element, a second light emitting element, and a third light emitting element or a group (light emitting unit) including four or more light emitting elements, and these light emitting elements are assumed as a single light emitting section, it means that when a circle including all the light emitting elements is assumed, the diameter of the circle is $D_0$. Otherwise, when each of the light emitting elements is not arranged in a straight line, it means that when a circle connecting the centers of the respective light emitting elements is assumed, the diameter of the circle is $D_0$, and when each of the light emitting elements is arranged in a straight line, it means that when a line segment connecting the centers of two light emitting elements positioned on the outermost side is assumed, the diameter of the circle whose diameter is the line segment is $D_0$. The assumption is the same as in the following description. In addition, the case in which the planar shape of the light transmission section (first light transmission section) is not a circle is included, an expression "it is assumed that the external shape of the light transmission section (first light transmission section) is a circle which has a diameter $D_1$" is used.

Further, in the display device of the first embodiment of the present disclosure which includes the above-described preferable configuration, a configuration can be made such that a light non-transmission section layer, provided with a second light transmission section that transmits light from the light emitting section, is formed on the first surface side of the second substrate in correspondence to each light emitting section, and the area of the second light transmission section is smaller (narrower) than the area of the light transmission section. Further, in the display device according to the first embodiment of the present disclosure which includes the above-described configuration or in the display device according to the second embodiment of the present disclosure which includes the above-described preferable configuration, when it is assumed that the external shape of the second light transmission section is a circle which has a diameter $D_2$, that the shape of the light emitting section is a circle which has a diameter $D_0$, that the distance from the top face of the light emitting section to the second light transmission section is $L_2$, and that the average refractive index of a light path from the light emitting section to the light non-transmission section layer provided with the second light transmission section is $n_2$, it is preferable that $\tan(\sin^{-1}(1/n_2)) \leq (D_2-D_0)/(2\cdot L_2) \leq 2$ is satisfied. Further, it is desirable that the center of the light emitting section, the center of the light transmission section (the center of the first light transmission section), and the center of the second light transmission section are on the same axis line, and that the light transmission section (first light transmission section) has a figure which is similar to the figure of the second light transmission section. Also, since the case in which the planar shape of the second light transmission section is not a circle is included, an expression "it is assumed that the external shape of the second light transmission is a circle which has a diameter $D_2$" is used.

Further, in the display device according to the first and second embodiments of the present disclosure which includes the above-described preferable configuration and structure, a configuration can be made such that the light emitting section includes a light emitting diode (LED). However, the present disclosure is not limited thereto and a configuration can be made such that the light emitting section includes a semiconductor laser element and an Electro-Luminescence (EL) element in addition thereto. Further, each light emitting section can be configured with a plurality of the light emitting elements (light emitting diodes) which are arranged in a straight line. Also, an expression "arranged in a straight line" in the sentence of "the plurality of the light emitting elements (light emitting diodes) are arranged in a straight line" means that not only a case where a plurality of the light emitting elements (light emitting diodes) are arranged strictly in a straight line but also a case where a plurality of the light emitting elements (light emitting diodes) are arranged so as to slightly deviate from a straight line for the design or manufacturing are included. That is, it means that a plurality of the light emitting elements (light emitting diodes) are arranged in an almost straight line. When the light emitting section is configured with the light emitting element, such as the light emitting diode or the semiconductor laser element, the size of the light emitting element (for example, a chip size) is not particularly restricted. The size of the light emitting element is typically minute and, more specifically, for example, 1 mm or less, for example, 0.3 mm or less, or, for example 0.1 mm or less. It is possible to exemplify light emitting elements which each use, for example, a nitride-based III-V group compound semiconductor as a light emitting element which emits red color, a light emitting element which emits green color and a light emitting element which emits blue color, and it is possible to exemplify a light emitting element which uses, for example, an AlGaInP-based compound semiconductor as the light emitting element which emits red color. When 1 pixel in the light emitting element type-display device is configured with a group (light emitting unit) including the first light emitting element, the second light emitting element and the third light emitting element, there is a case in which it is desirable that the group (light emitting unit) including the first light emitting element, the second light emitting element and the third light emitting element is assumed as a single light emitting section depending on the arrangement state of the first light emitting element, the second light emitting element and the third light emitting element. That is, in the display device according to the first embodiment or the second embodiment of the present disclosure, a configuration can be made such that the light transmission suppression layer, provided with a single light transmission section which transmits light from the single light emitting section including a single light emitting unit, is formed on the second surface of the second substrate in correspondence to the single light emitting section which is configured with the single light emitting unit. In the display device according to the second embodiment of the present disclosure, a configuration can be made such that a single second light transmission section, which transmits light from a single light emitting section configured with a single light emitting unit, is provided on the light non-transmission section layer.

In addition, it is possible to use the display device as a tiling-type display device in which a plurality of the display devices according to the first and second embodiments of the present disclosure which includes the above-described preferable configuration and structure are arranged. Further, in this case, a configuration can be made such that different colors or patterns are provided for respective tiles.

In the display device according to the first and second embodiments of the present disclosure which includes the above-described preferable configuration and structure (hereinafter, there is a case in which the display device is collectively simply referred to as "display device according to the embodiments of the present disclosure"), the light transmission suppression layer and the light non-transmission section layer are formed in such a way as to straddle adjacent pixels (or sub-pixels), and gaps are not present therebetween.

In the display device according to the embodiments of the present disclosure, it is possible to exemplify a polyether sulfone (PES) film, a polyethylene naphthalate (PEN) film, a polyimide (PI) film, a polyethylene terephthalate (PET) film, or a polyolefin film as the first substrate or the second substrate. Further, it is possible to exemplify a glass substrate, a substrate acquired by bonding the various films to the glass substrate, a substrate acquired by forming a polyimide resin layer, an acrylic resin layer, a polystyrene resin layer, or a silicone gum layer on the glass substrate. In addition, in the first substrate, it is possible to replace the glass substrate with a metallic substrate or a metallic sheet, an alloy substrate, an alloy sheet, a ceramic substrate, a ceramic sheet, a semiconductor substrate, a plastic substrate, or a plastic sheet. Further, it is possible to exemplify a printed-wiring board (which includes a rigid printed-wiring board and a flexible printed-wiring board) on which wiring is formed as the first substrate, and it is possible to exemplify a substrate, the surface of which is formed with an insulating film.

As a material which configures the light transmission suppression layer having an anti-reflection function or a light non-transmission section layer, it is possible to exemplify a material, such as glass paste or black pigment which includes conductive particles, such as carbon, a metallic thin film (for example, chrome, nickel, aluminum, molybdenum, or an alloy thereof), metallic oxide (for example, chrome oxide), metallic nitride (for example, chrome nitride), heat resistant organic resin, glass paste, black pigment, or silver. Further, it is possible to form such a layer using a method, which is appropriately selected depending on a material to be used, such as, for example, a combination of a vacuum deposition method or a sputtering method and an etching method, a combination of a vacuum deposition method and a sputtering method, a combination of a spin coating method and a liftoff method, various print methods including an ink-jet print method, and a lithography technology.

It is possible to configure the anti-reflection layer using, for example, various fluorine resin layers which each have a low refractive index (for example, 1.35 or less), a dielectric multilayer film, a mesoporous silica film, and the composite membrane thereof.

It is possible to exemplify ink or paint which is appropriate to form a pattern as a material which configures the light transmission suppression layer to which pattern is attached. A protective layer may be formed on the surface of the light transmission suppression layer to which the pattern is attached in order to improve durability or weatherability. The pattern includes a picture, a letter, a logo, a symbol, a code, a mark, a seal, and a design.

Otherwise, in order to accomplish the second advantage, a display device according to a third embodiment of the present disclosure includes: a first substrate which includes a first surface and a second surface which faces the first surface; a second substrate which is arranged to face the first substrate, and is configured to include a first surface which faces the second surface of the first substrate and a second surface which faces the first surface; and a plurality of light emitting sections which are provided on the second surface of the first substrate while being separated from the second substrate. A pattern display device, which includes a micro capsule type, an electron powder fluid type, a liquid crystal type, an electrowetting type, an electrophoresis type, a chemical change type or an electrophoresis type electronic paper or a transparent liquid crystal display device, is arranged on the second surface side or the first surface side of the second substrate, and displays a pattern on the pattern display device. When the pattern is displayed on the pattern display device, an image is not displayed on the light emitting section. On the other hand, when an image is displayed on the light emitting section, the pattern is not displayed on the pattern display device.

Otherwise, in order to accomplish the second advantage, a display device according to a fourth embodiment of the present disclosure includes: a first substrate that includes a first surface and a second surface which faces the first surface; a second substrate that is arranged to face the first substrate, and that includes a first surface which faces the second surface of the first substrate and a second surface which faces the first surface; and a plurality of light emitting sections that are provided on the second surface of the first substrate while being separated from the second substrate. A pattern is formed on the first surface side of the second substrate. A configuration can be made such that the pattern is expressed by irregularities on a layer which is positioned at the bottom of the first surface of the second substrate.

The number, the kind, the implementation (arrangement), and the intervals of light emitting sections (for example, light emitting elements) which configure the display device are determined depending on the purpose or the function of the display device and the specification which is necessary for the display device. If the display device is configured with a light emitting element which emits red color, a light emitting element which emits green color and a light emitting element which emits blue color, it is possible to acquire a light emitting element type-display device which displays color. If the display device is configured with the light emitting element type-display device which displays colors, 1 pixel in the light emitting element type-display device is configured with a group (light emitting unit) including the first light emitting element, the second light emitting element and the third light emitting element. In addition, a sub-pixel is configured with each light emitting element. Further, a plurality of light emitting units is arranged in a 2-dimensional matrix shape in the first direction and in the second direction which is perpendicular to the first direction. When it is assumed that the number of first light emitting elements which configure the light emitting unit is $N_1$, the number of second light emitting elements which configure the light emitting unit is $N_2$ and the number of third light emitting elements which configure the light emitting unit is $N_3$, it is possible to exemplify an integer which is 1 or 2 or greater as $N_1$, it is possible to exemplify an integer which is 1 or 2 or greater as $N_2$, and it is possible to exemplify an integer which is 1 or 2 or greater as $N_3$. The values of $N_1$, $N_2$, and $N_3$ may be equal or different. When the values of $N_1$, $N_2$, and $N_3$ are integers which each are 2 or greater, the light emitting elements may be connected in series or may be connected in parallel in a single light emitting unit. Although the combination of the values of ($N_1$, $N_2$, $N_3$) is not limited, it is possible to exemplify (1, 1, 1), (1, 2, 1), (2, 2, 2), and (2, 4, 2). Also, as described above, it is possible to assume that a single light emitting unit is a single light emitting section. In this case, as described above, in the display device according to the first embodiment or the second embodiment of the present disclosure, a configuration can be made such that a light transmission suppression layer, provided with a single light transmission section which transmits light from a single light emitting section configured with a single light emitting unit, is formed on the second surface of the second substrate in correspondence to the single light emitting section configured with a single light emitting unit. In the display device according to the second embodiment of the present disclosure, a configuration can be made such that a single second light transmission section which transmits light from the single light emitting section configured with the single light emitting unit is provided on the light non-transmission section layer.

First Example

Figure 1B:
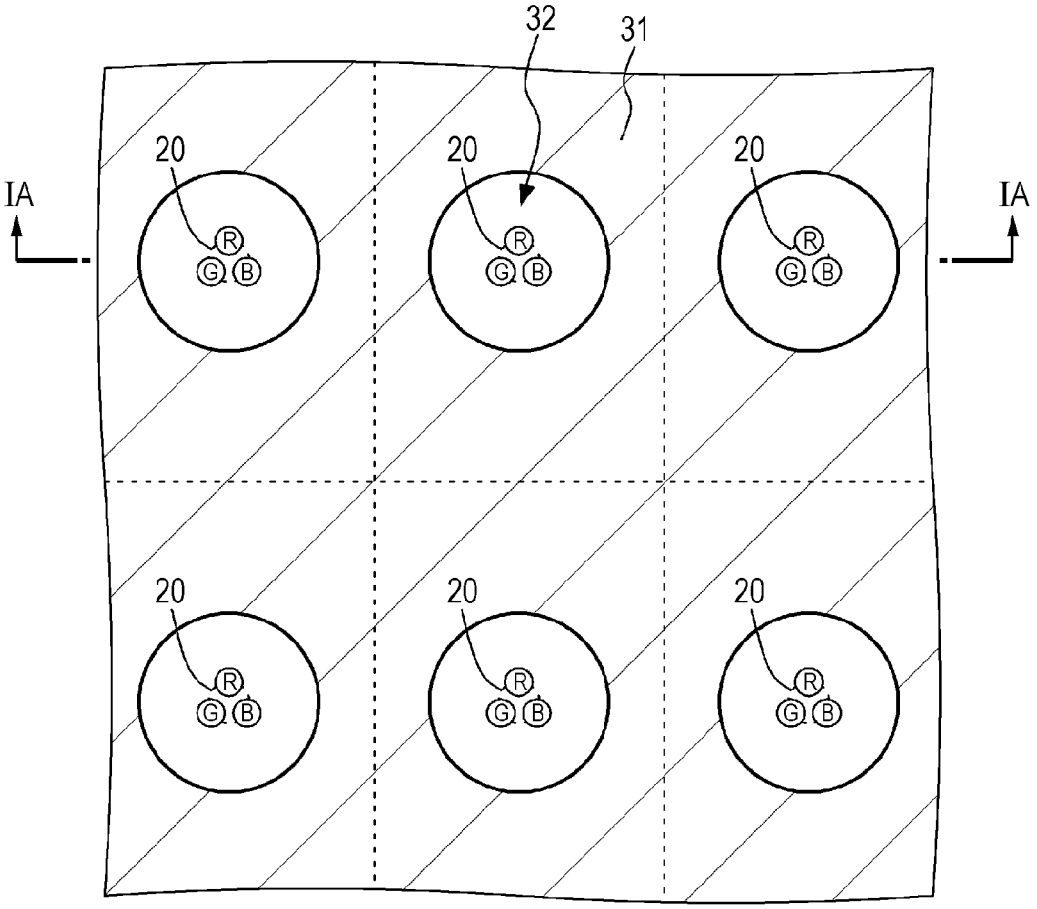

A first example relates to the display device according to the first embodiment of the present disclosure. FIG. 1A is a schematic partial sectional view of the display device according to the first example, and FIG. 1B is a schematic partial sectional view thereof. Also, FIG. 1A is a schematic partial sectional view taken along the line IA-IA in FIG. 1B. Each of the display device 10A according to the first example and display devices 10B, 10C, and 10D according to second to fourth examples which will be described later includes: a first substrate 11 which includes a first surface 11A and a second surface 11B which faces the first surface 11A; a second substrate 12 which is arranged to face the first substrate 11, and which is configured to include a first surface 12A that faces the second surface 11B of the first substrate 11 and a second surface 12B that faces the first surface 12A; and a plurality of light emitting sections 20 (20R, 20G, and 20B) which are provided on the second surface 11B of the first substrate 11 while being separated from the second substrate 12.

Further, in the display device 10A according to the first example, a light transmission suppression layer 31, provided with light transmission sections 32 that transmit light from the light emitting sections 20, is formed on the second surface 12B of the second substrate 12 in correspondence to the respective light emitting sections 20. An anti-reflection layer 33 is formed in the light transmission sections 32. Light from the light emitting sections 20 passes through the light transmission sections 32 and then is emitted to the outside.

Here, in the display device 10A according to the first example, the light transmission suppression layer 31 includes an anti-reflection function. Further, accordingly, it is possible to provide a display device which includes high durability and includes a configuration and a structure in which sufficient low reflectance can be accomplished. The light transmission suppression layer 31 includes a specular reflectance at the same level as that of the specular reflectance of the anti-reflection layer 33. More specifically, although the specular reflectance is not limited, the specular reflectance satisfies 0≤(the specular reflectance of the light transmission suppression layer/the specular reflectance of the anti-reflection layer)≤2.

Figure 2A:
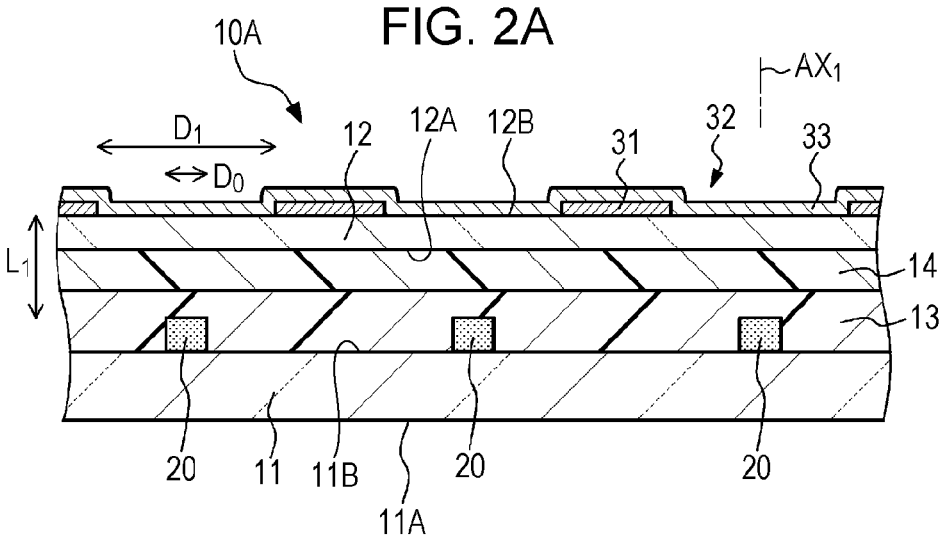
FIG. 2A a partial schematic sectional view illustrating a modification example of the display device according to the first example.

Further, in the display device 10A according to the first example, as shown in FIG. 1A, the anti-reflection layer 33 extends between the light transmission suppression layer 31 and the second surface 12B of the second substrate 12. Otherwise, as shown in FIG. 2A, the anti-reflection layer 33 covers the light transmission suppression layer 31.

In addition, a protective film 13 which is formed of silicone resin and an adhesive layer 14 which is formed of acrylic resin or silicone resin are provided between the first substrate 11 and the second substrate 12.

In the first example, each of the light emitting sections 20 is configured with a light emitting element which is formed of a light emitting diode. More specifically, the display device 10A is configured with a light emitting element type-display device, and a single pixel in the light emitting element type-display device is configured with a group (light emitting unit) including a first light emitting element 20R which emits red color, a second light emitting element 20G which emits green color, and a third light emitting element 20B which emits blue color. A sub-pixel is configured with each of the light emitting elements 20R, 20G, and 20B. Further, a plurality of light emitting units is arranged in a 2-dimensional matrix shape in the first direction and in the second direction which is perpendicular to the first direction. When it is assumed that the number of first light emitting elements which configure the light emitting unit is $N_1$, that the number of second light emitting elements which configure the light emitting unit is $N_2$ and that the number of third light emitting elements which configure the light emitting unit is $N_3$, setting is made such that $(N_1, N_2, N_3)=(1, 1, 1)$. However, the present disclosure is not limited thereto. Here, in each example, it is assumed that a group (light emitting unit) which includes the first light emitting element 20R, the second light emitting element 20G and the third light emitting element 20B is a single light emitting section 20. Further, the light transmission suppression layer 31, provided with a single light transmission section 32 that transmits light from the single light emitting section 20 configured with a single light emitting unit, is formed on the second surface 12B of the second substrate 12 in correspondence to the single light emitting section 20 which is configured with a single light emitting unit. Also, an external shape of the light transmission section 32 is a circle which has a diameter $D_1$. The centers of the respective light emitting elements 20R, 20G, and 20B are disposed at the apexes of a regular triangle, and the respective light emitting elements 20R, 20G, and 20B are arranged on the circumference of a circle. Here, when a circle including the respective light emitting elements 20R, 20G, and 20B is assumed, the diameter of the circle is set to $D_0$. In addition, in FIGS. 1A, 2A, 3A, 4A, 4B, 5A, 5B, 5C, 12A, 12B, and 13, the light emitting units are indicated using dots as the light emitting sections 20. In addition, in FIGS. 1B, 3B, 6, 7, 8, 9, and 10, the first light emitting element 20R is expressed by allocating "R" at the center of a circular mark, the second light emitting element 20G is expressed by allocating "G" at the center of a circular mark, the third light emitting element 20B is expressed by allocating "B" at the center of a circular mark, and the circle connecting the centers of the respective light emitting elements 20R, 20G, and 20B is expressed by dotted lines.

In the first example, the first substrate 11 is configured with a glass epoxy printed-wiring board on which wiring (not shown in the drawing) is formed, and the second substrate 12 is configured with a polyolefin film. In addition, the light transmission suppression layer 31 is configured with solidified paint (ink) in which carbon is dispersed and formed based on an ink-jet print method. The anti-reflection layer 33 is configured with a fluorine resin layer and formed based on a print method.

Figure 2B:
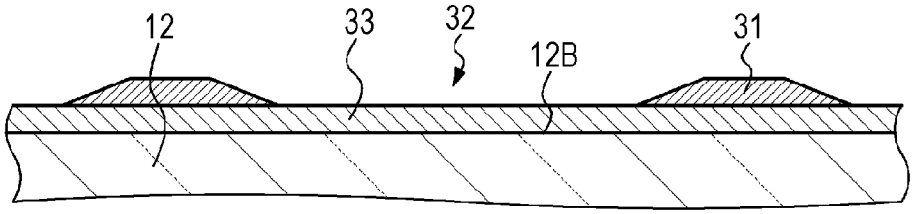
FIGS. 2B, 2C, and 2D are partial schematic enlarged sectional views illustrating the part of a light transmission section of the display device according to the first example.
Figure 2C:
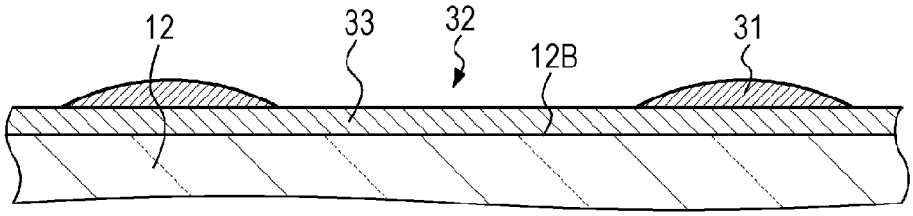
Figure 2D:
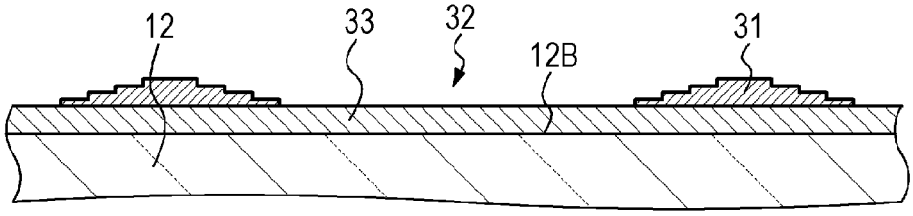

FIGS. 2B, 2C, and 2D are partial schematic sectional views illustrating a part of the light transmission section which is enlarged. The thickness of the light transmission suppression layer 31 may be the same (refer to FIGS. 1A and 2A) and may be thin as being close to the light transmission section 32 in order to accomplish a wider view angle. More specifically, the change in the thickness of the light transmission suppression layer 31 may be linear change (refer to FIG. 2B), smooth curved change (refer to FIG. 2C), and step change (refer to FIG. 2D). It is possible to control the thickness of light transmission suppression layer 31 by controlling ink discharge amount when the light transmission suppression layer 31 is formed based on, for example, the ink-jet print method.

In addition, when it is assumed that the external shape of the light transmission section 32 is a circle which has a diameter $D_1$, that the light emitting section 20 is a circle which has a diameter $D_0$, that the distance from the top face of the light emitting section 20 to the light transmission section 32 is $L_1$, and that the average refractive index of a light path (more specifically, a light path which passes through the protective film 13, the adhesive layer 14, the second substrate 12 and the anti-reflection layer 33) from the light emitting section 20 to the light transmission suppression layer 31 provided with the light transmission section 32 is set to $n_1$, $\tan(\sin^{-1}(1/n_1)) \leq (D_1-D_0)/(2\cdot L_1) \leq 2$ is satisfied. The center of the light emitting section 20 and the center of the light transmission section 32 are on the same axis line $AX_1$.

As described above, in the display device according to the first example, the light transmission suppression layer, provided with the light transmission section which transmits light from the light emitting section and configured to include an anti-reflection function, is formed on the second surface of the second substrate in correspondence to each light emitting section. Further, the anti-reflection layer is formed on the light transmission section. Therefore, it is possible to provide a display device which includes high durability and which can accomplish sufficient low reflectance.

Second Example

Figure 3A:
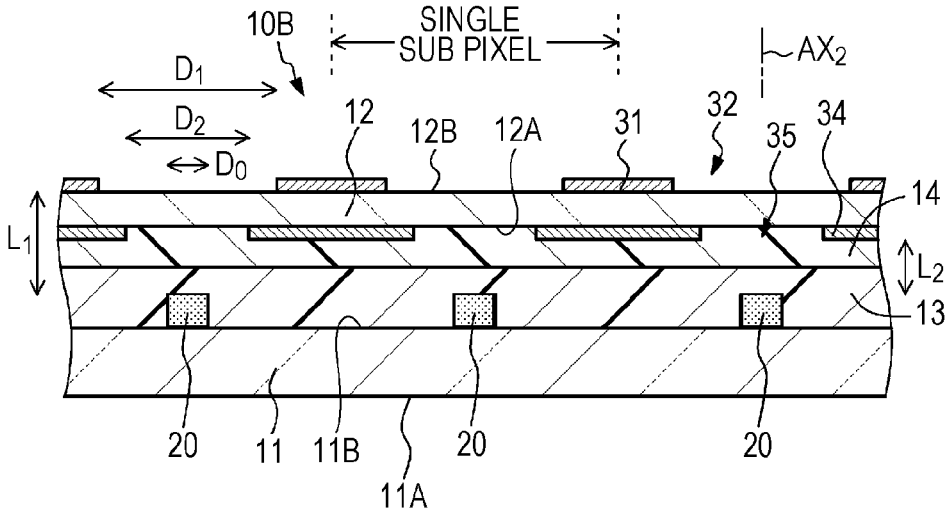
FIGS. 3A and 3B are a partial schematic sectional view and a partial schematic plan view illustrating a display device according to a second example.
Figure 3B:
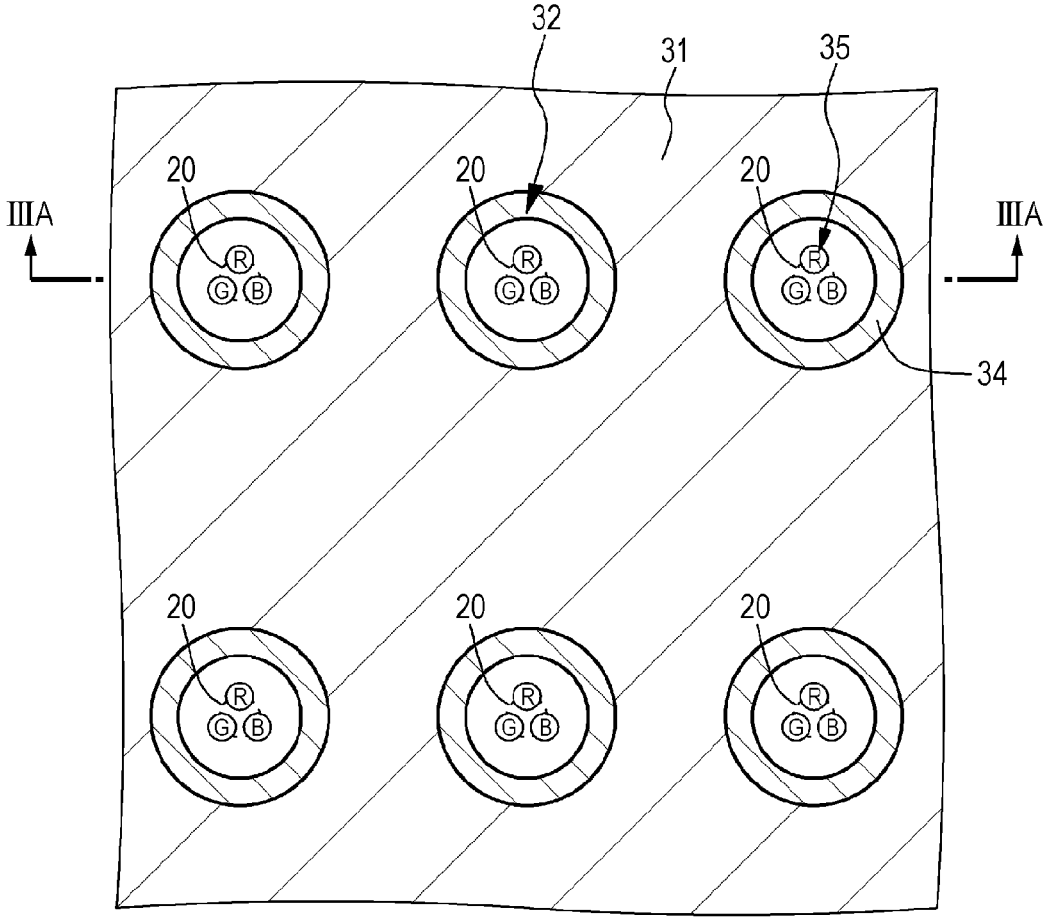
Figure 4A:
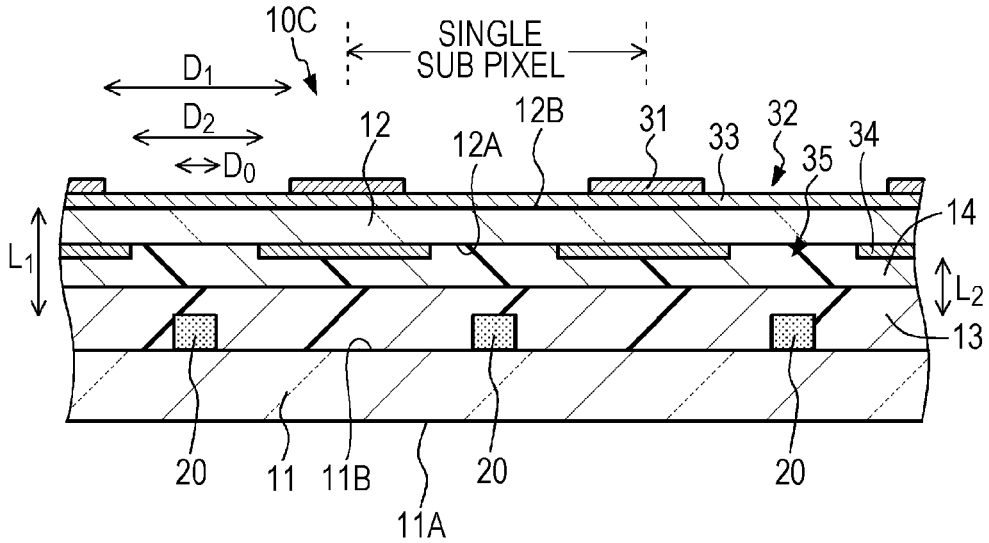
FIGS. 4A and 4B are partial schematic sectional views illustrating display devices according to a third example and a modification example.
Figure 4B:
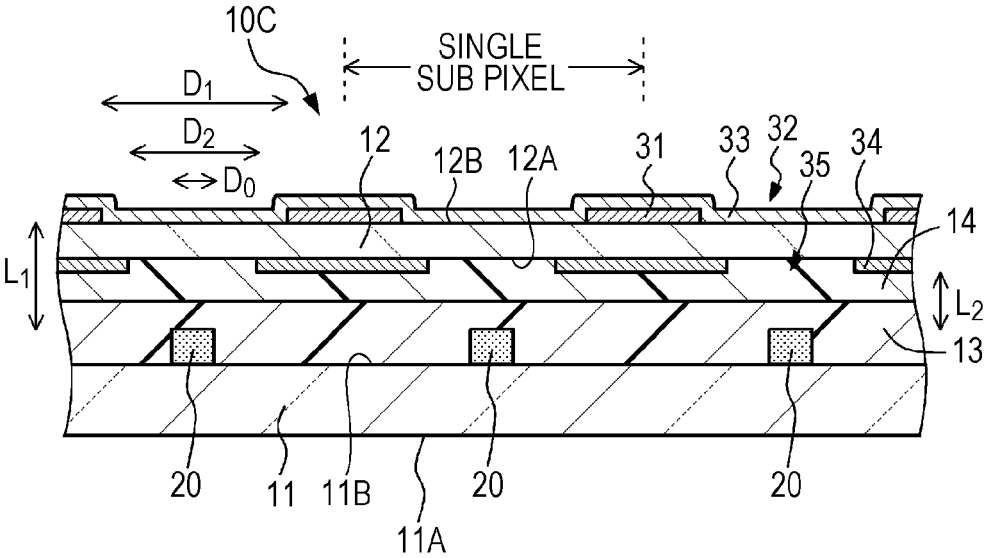

The second example relates to a display device according to the second embodiment of the present disclosure. FIG. 3A is a partial schematic sectional view illustrating the display device according to the second example, and FIG. 3B is a partial schematic plan view. Also, FIG. 3A is a partial schematic sectional view taken along the line IIIA-IIIA in FIG. 3B. In a display device 10B according to the second example, the light transmission suppression layer 31, provided with a first light transmission section 32 which transmits light from the light emitting section 20, is formed on the second surface 12B of the second substrate 12 and a light non-transmission section layer 34, provided with a second light transmission section 35 which transmits light from the light emitting section 20, is formed on the first surface side of a second substrate 12 in correspondence to each light emitting section 20. The area of the second light transmission section 35 is smaller (narrower) than the area of the first light transmission section 32. Here, although the light non-transmission section layer 34 is formed on the first surface side of the second substrate 12, more specifically, the light non-transmission section layer 34 may be formed on the first surface of the second substrate 12 and the area between the light emitting section 20 and the first surface of the second substrate 12. That is, as shown in the drawings, the light non-transmission section layer 34 may be formed on the first surface 12A of the second substrate 12 and, alternatively, may be formed on the protective film 13 (refer to FIG. 5A). The light non-transmission section layer 34 is formed in the same manner in the description below. In addition, the single second light transmission section 35, which transmits light from the single light emitting section 20 configured with a group (a single light emitting unit) including a first light emitting element 20R which emits red color, a second light emitting element 20G which emits green color, and a third light emitting element 20B which emits blue color, is provided on the light non-transmission section layer 34. An external shape of the second light transmission section 35 is a circle which has a diameter $D_2$.

In the second example, the light non-transmission section layer 34 is configured with a black matrix material for a liquid crystal display device, and is formed based on a photolithography technology. Like the first example, the light transmission suppression layer 31 includes an anti-reflection function in the second example. In addition, like the first example, the thickness of the light transmission suppression layer 31 may be the same thickness (refer to FIG. 3A), and may be thin as being close to the first light transmission section 32 in order to accomplish a wider view angle (refer to FIGS. 2B, 2C, and 2D). Light from the light emitting section 20 passes through the second light transmission section 35 and the first light transmission section 32, and is emitted to the outside. The thickness of the light non-transmission section layer 34 may be the same thickness and may be thin as being close to second light transmission section 35 in order to accomplish a wider view angle. More specifically, the change in the thickness of the light non-transmission section layer 34 may be a linear-shaped change, a smooth curved change, or a stepped change. It is possible to control the thickness of the light non-transmission section layer 34 by controlling ink discharge amount when the light non-transmission section layer 34 is formed based on, for example, the ink-jet print method.

Figure 5A:
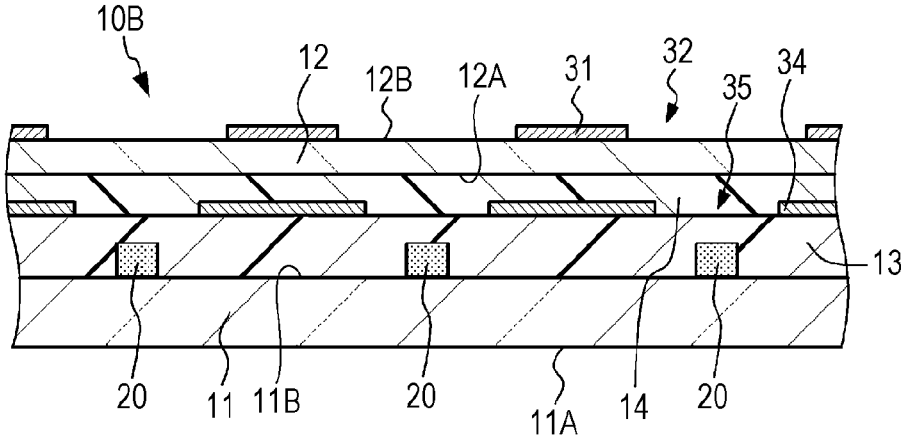
FIG. 5A is a partial schematic sectional view illustrating a modification example of the display device according to the second example.
Figure 5B:
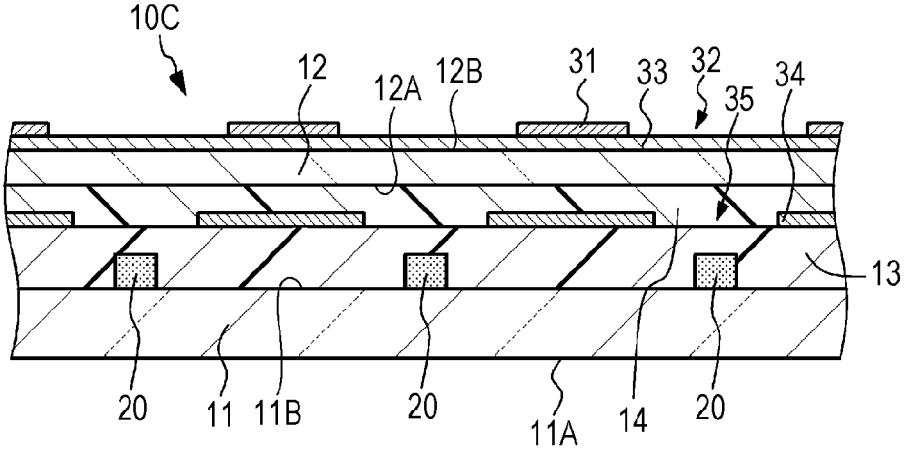
FIGS. 5B and 5C are partial schematic sectional views illustrating another modification example of the display device according to the third example.
Figure 5C:
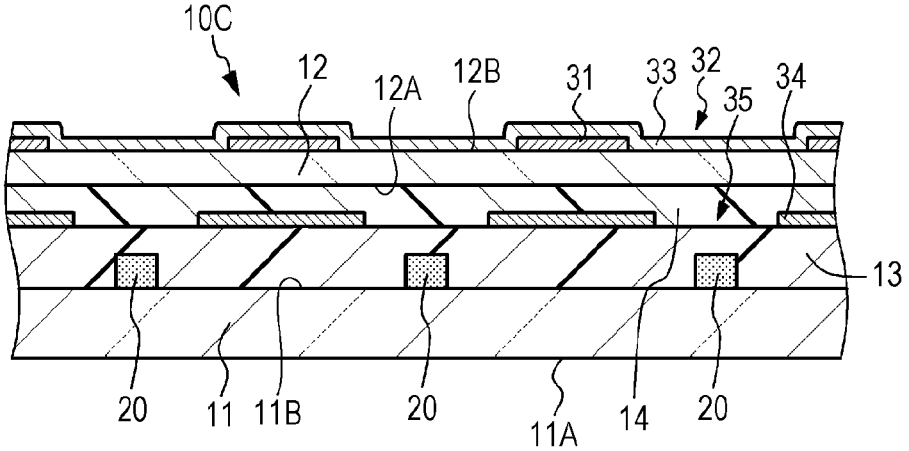
Figure 6:
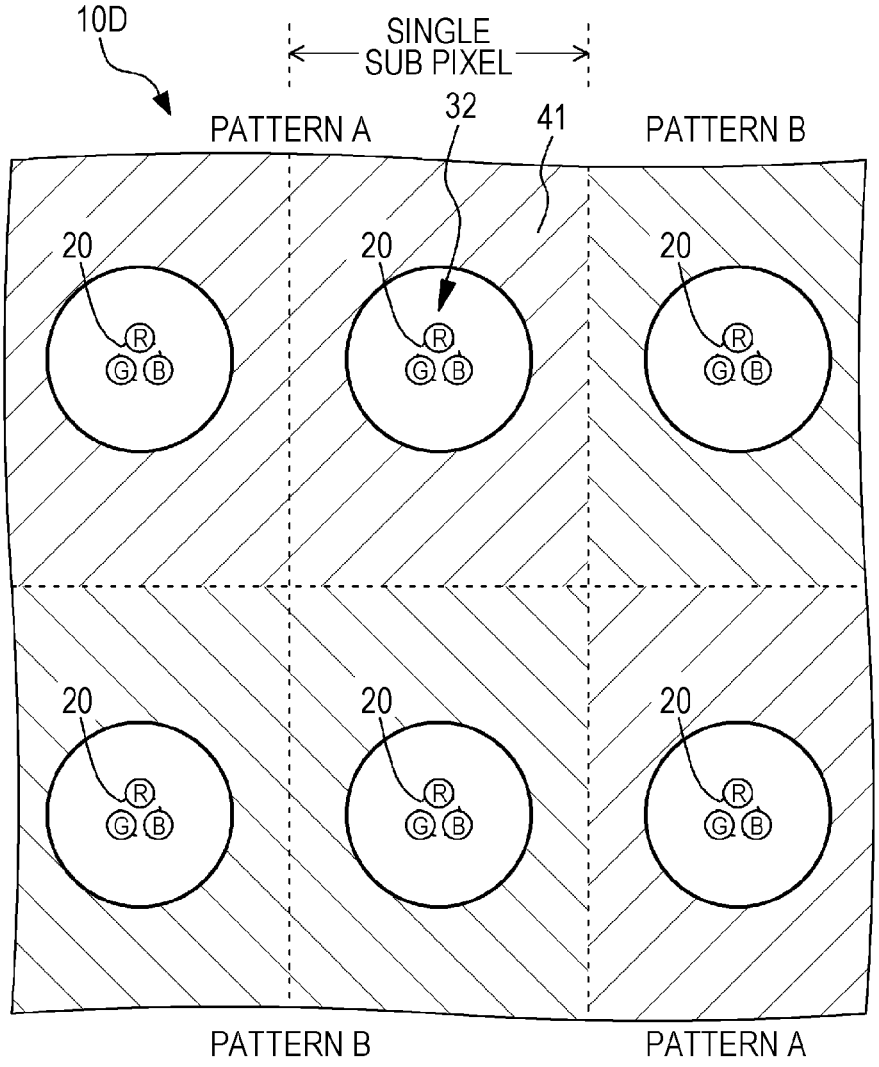
FIG. 6 is a partial schematic plan view illustrating a display device according to a fourth example.
Figure 7:
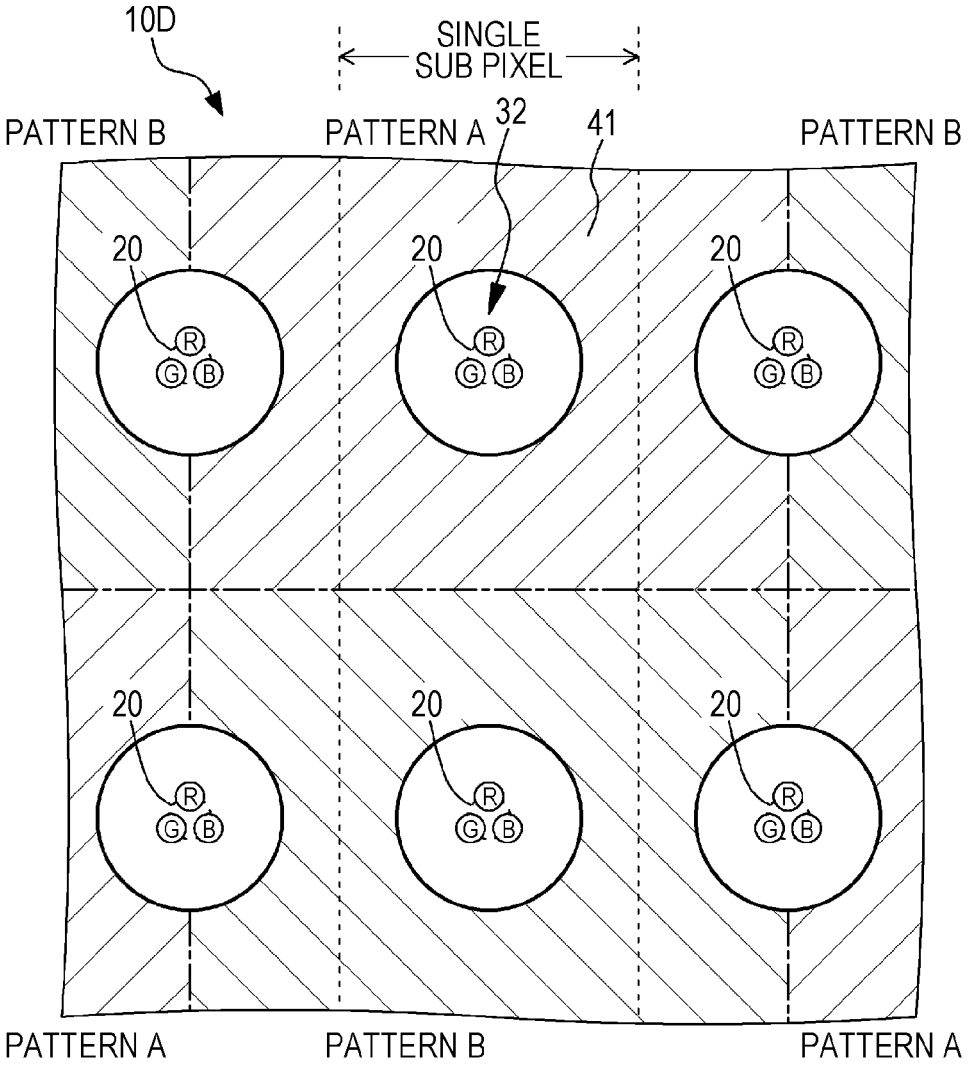
FIG. 7 is a partial schematic plan view illustrating a modification example of the display device according to the fourth example.
Figure 8:
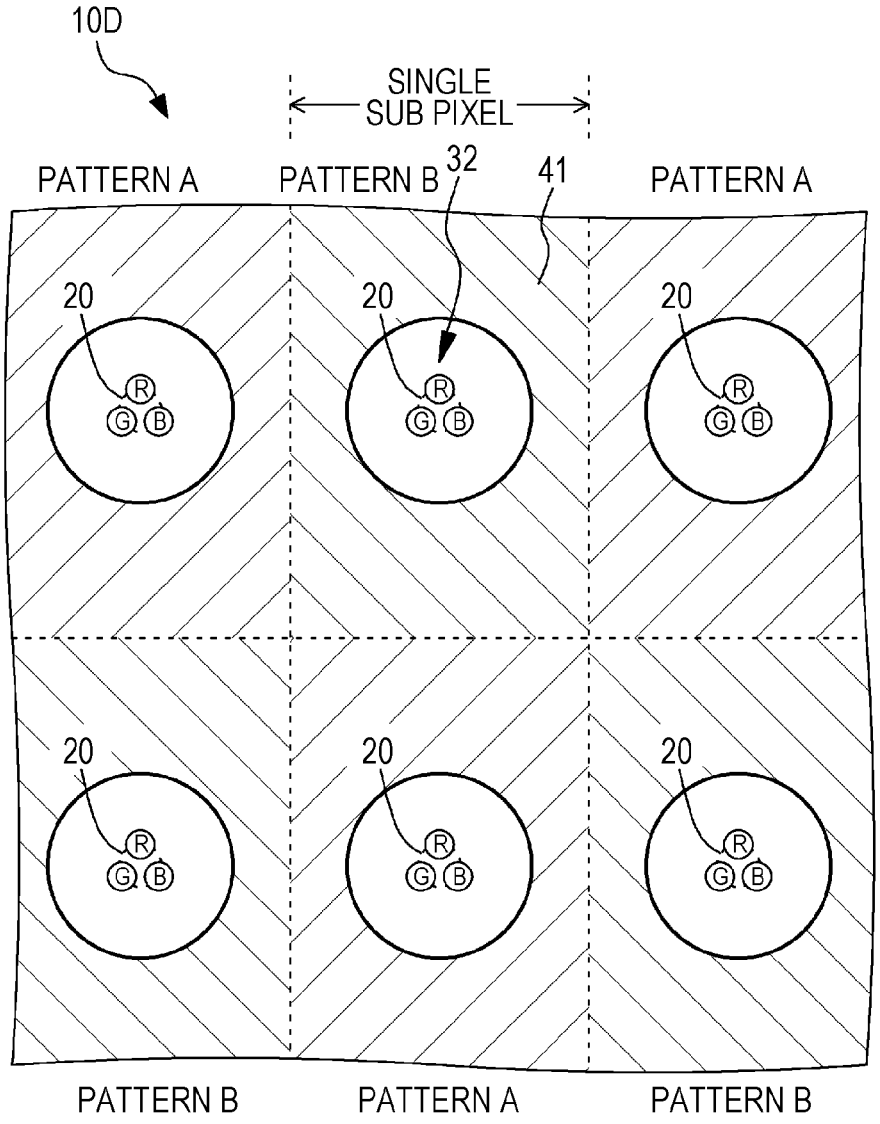
FIG. 8 is a partial schematic plan view illustrating another modification example of the display device of the fourth example.
Figure 9:
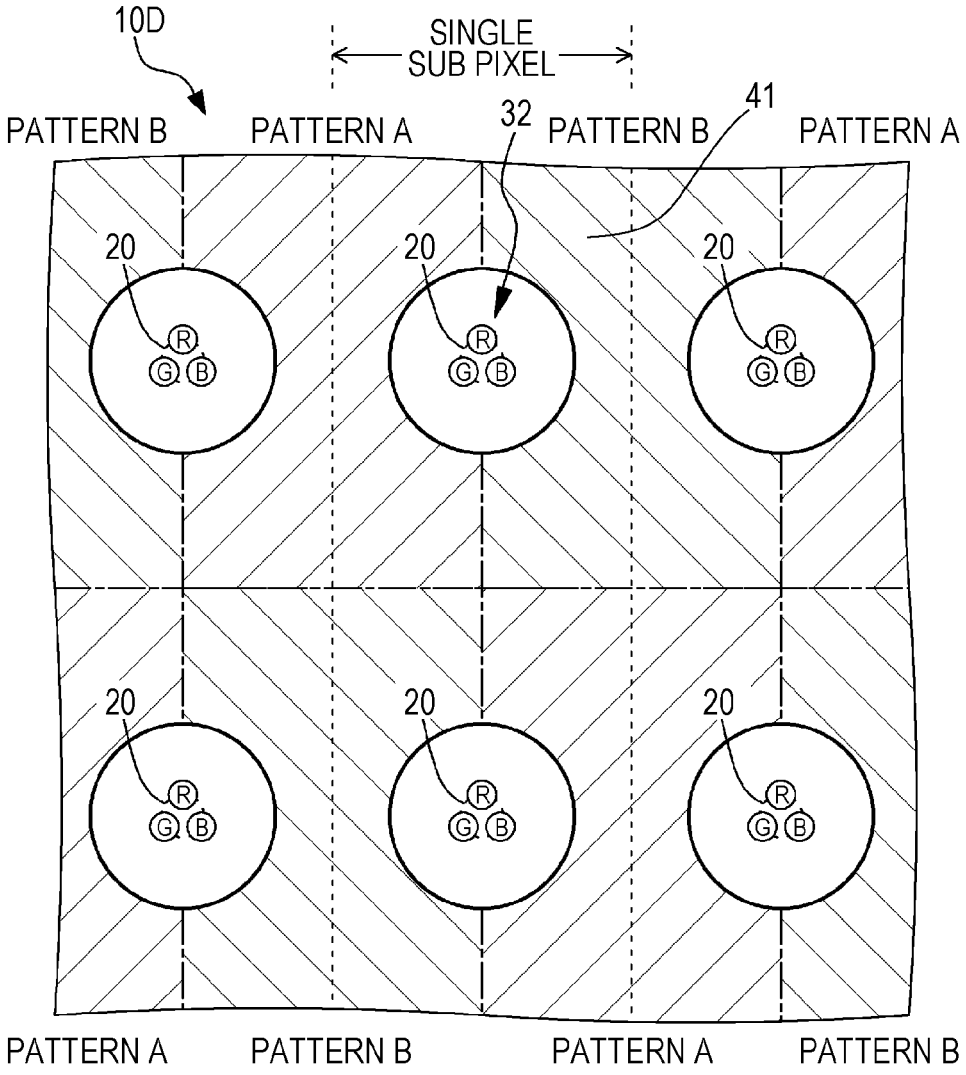
FIG. 9 is a partial schematic plan view illustrating a still another modification example of the display device according to the fourth example.
Figure 10:
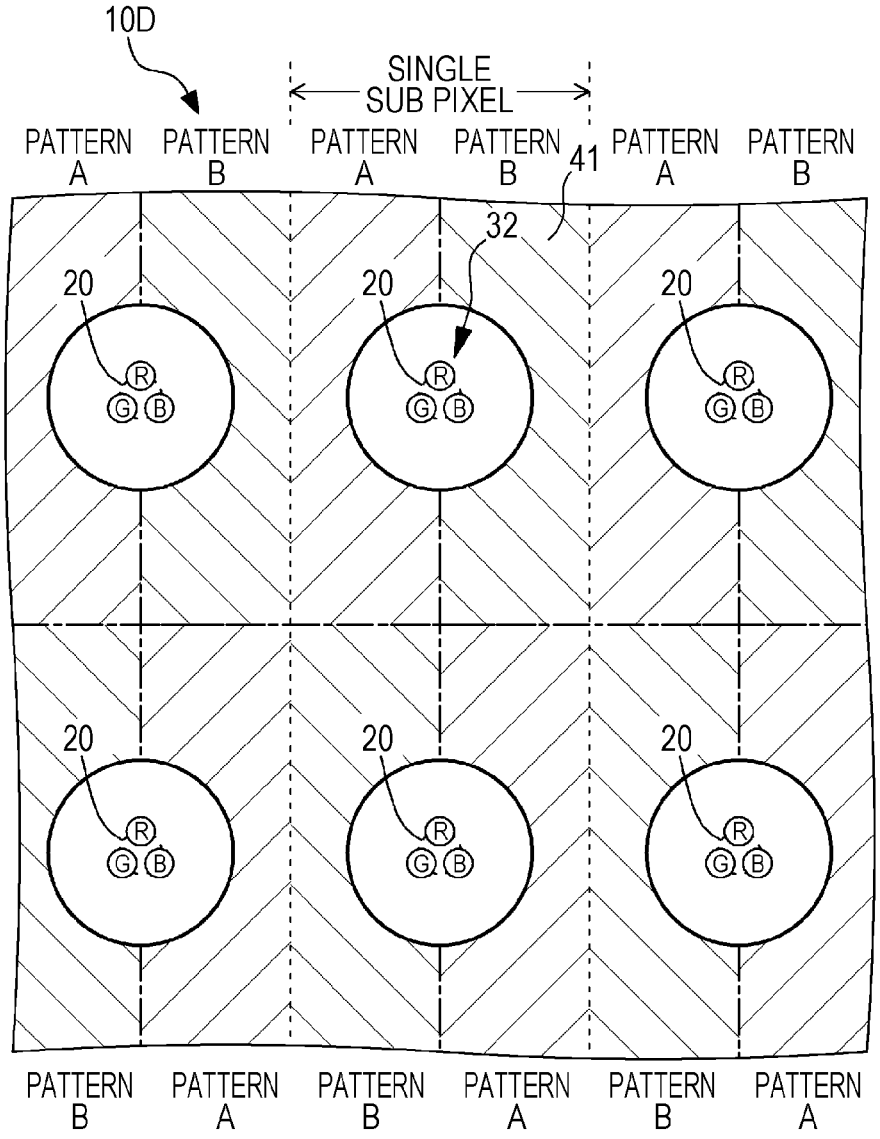
FIG. 10 is a partial schematic plan view illustrating a still another modification example of a display device according to the fourth example.

Also, like the first example, when it is assumed that the external shape of the first light transmission section 32 is a circle which has a diameter $D_1$, that the light emitting section 20 is a circle which has a diameter $D_0$, that the distance from the top face of the light emitting section 20 to the first light transmission section 32 is $L_1$, and that the average refractive index of a light path (more specifically, a light path which passes through the protective film 13, the adhesive layer 14, and the second substrate 12 in examples shown in FIGS. 3A and 5A, and a light path which passes through the protective film 13, the adhesive layer 14, the second substrate 12, and the anti-reflection layer 33 in examples shown in FIGS. 4A, 4B, 5B, and 5C) from the light emitting section 20 to the light transmission suppression layer 31 provided with the light transmission section 32 is $n_1$, $\tan(\sin^{-1}(1/n_1))\leq(D_1-D_0)/(2\cdot L_1)\leq 2$ is satisfied. Further, when it is assumed that the external shape of the second light transmission section 35 is a circle which has a diameter $D_2$, that the light emitting section 20 is a circle which has a diameter $D_0$, that the distance from the top face of the light emitting section 20 to the second light transmission section 35 is $L_2$, and that the average refractive index of a light path (more specifically, a light path which passes through the protective film 13 and the adhesive layer 14 in examples shown in FIGS. 3A and 4A, and 4B, a light path which passes through the protective film 13 in the examples shown in FIGS. 5A, 5B, and 5C) from the light emitting section 20 to the light non-transmission section layer 34 provided with the second light transmission section 35 is $n_2$, $\tan(\sin^{-1}(1/n_2))\leq(D_2-D_0)/(2\cdot L_2)\leq 2$ is satisfied. The center of the light emitting section 20, the center of the first light transmission section 32, and the center of the second light transmission section 35 are on the same axis line $AX_2$, and the first light transmission section 32 has a figure which is similar to the figure of the second light transmission section 35.

As describe above, in the display device of the second example, the light transmission suppression layer, provided with the first light transmission section which transmits light from the light emitting section and configured to include the anti-reflection function, is formed on the second surface of the second substrate in correspondence to each light emitting section. Since the light non-transmission section layer provided with the second light transmission section which transmits light from the light emitting section is formed on the first surface side of the second substrate and the area of the second light transmission section is smaller (narrower) than the area of the first light transmission section, it is possible to provide a display device which includes high durability and which can accomplish sufficient low specular reflectance.

Third Example

A third example is a modification of the first example, and relates to the combination of the display device 10A according to the first example and the display device 10B according to the second example. That is, as shown in partial schematic sectional views in FIGS. 4A, 5B, and 5C, in a display device 10C according to the third example, in addition to the configuration of the display device 10A according to the first example, the light non-transmission section layer 34, provided with the second light transmission section 35 which transmits light from the light emitting section 20, is formed on the first surface side of the second substrate 12 in correspondence to each light emitting section 20, and the area of the second light transmission section 35 is smaller (narrower) than the area of the light transmission section 32. Also, in FIG. 4A, the light non-transmission section layer 34 is formed on the first surface 12A of the second substrate 12. On the other hand, in FIGS. 5B and 5C, the light non-transmission section layer 34 is formed on the protective film 13.

The configurations and structures of the light non-transmission section layer 34 and the second light transmission section 35 are the same as in the description of the second example, the detailed description thereof will not be repeated.

Fourth Example

A fourth example is a modification of the first example. In a display device 10D according to the fourth example shown in partial schematic plan views in FIGS. 6, 7, 8, 9 and 10, patterns (for example, a "pattern A" and a "pattern B") are attached to the light transmission suppression layer 41. Here, in FIGS. 6, 7, 8, 9 and 10, for the purpose of simplification of drawings, the pattern A is expressed through hatching from the upper right side to the lower left side, and the pattern B is expressed using hatching from the upper right side to the lower left side. The light transmission suppression layer 41 is formed based on the print method, more specifically, for example, the ink-jet print method. More specifically, it is possible to use, for example, a pattern which has a short cycle like the wallpaper of a building material, a favorite color (wine red, deep blue, or tender green), and two or more colors which are slightly different from each other in units of pixels, or a drawing which includes a pattern in units of pixels (a geometrical pattern of a checker board design or a company name logo) as a pattern which includes a picture, a letter, a logo, a symbol, a code, a mark, a seal, and a design. Here, the pattern formation pitch is the integer multiple (refer to FIGS. 6 and 7), the equivalent multiple (refer to FIGS. 8 and 9), or the integer fraction (refer to FIG. 10) of the arrangement pitch of the light emitting section 20. In FIGS. 6, 7, 8 and 9, the pattern is deviated by half of the arrangement pitch of light emitting section. In addition, in FIGS. 6, 7, 8, 9, and 10, the boundary between sub-pixels is expressed by dotted lines, and the boundary between the patterns is expressed by dotted lines or dashed lines.

It is possible to apply such a configuration in which patterns are attached to the light transmission suppression layer 41 to the display device 10B according to the second example and the display device 10C according to the third example. That is, the light transmission suppression layer 41 may replace the light transmission suppression layer 31 according to the second example and the third example.

When the display device does not display an image because of attaching a pattern to the light transmission suppression layer, that is, when the display device does not operate, it is possible to apply preferable impression in an environment (for example, a living room at home) in which the display device is arranged. In a display device according to the related art in which the outermost surface of the display device is black, it is difficult to respond to such a demand of a customer. In addition, in a liquid crystal display device or an organic electroluminunance display device according to the related art, the light emitting sections occupy almost all the pixel areas, and thus it is extremely difficult to make patterns. In addition, in order to perform printing with a higher freedom degree, it is desirable to perform printing on the outermost surface of the display device. However, there are few areas in the outermost surface of the display device on which printing can be performed. On the other hand, in the light emitting element type-display device according to the fourth example, an area acquired when the light emitting section is projected onto the second surface of the second substrate is small (narrow) and the area of the light transmission suppression layer 41 which occupies the second surface of the second substrate is large (wide), and thus there is enough room for expression of patterns.

Fifth Example

Figure 11:
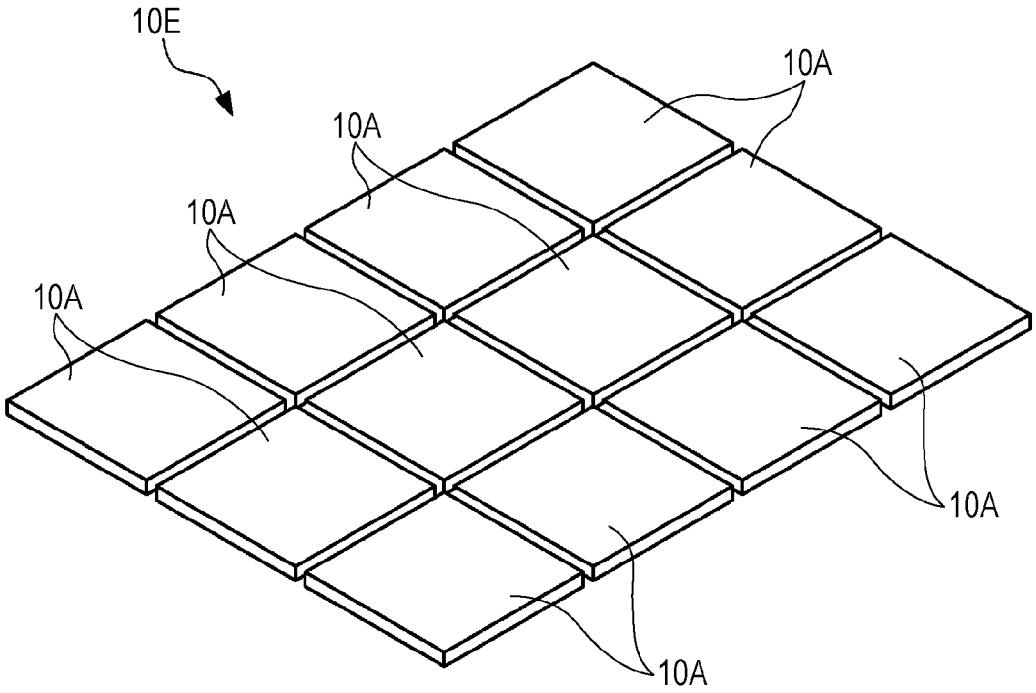
FIG. 11 is a conceptual diagram illustrating a display device (tiling-type display device) according to a fifth example.
Figure 12A:
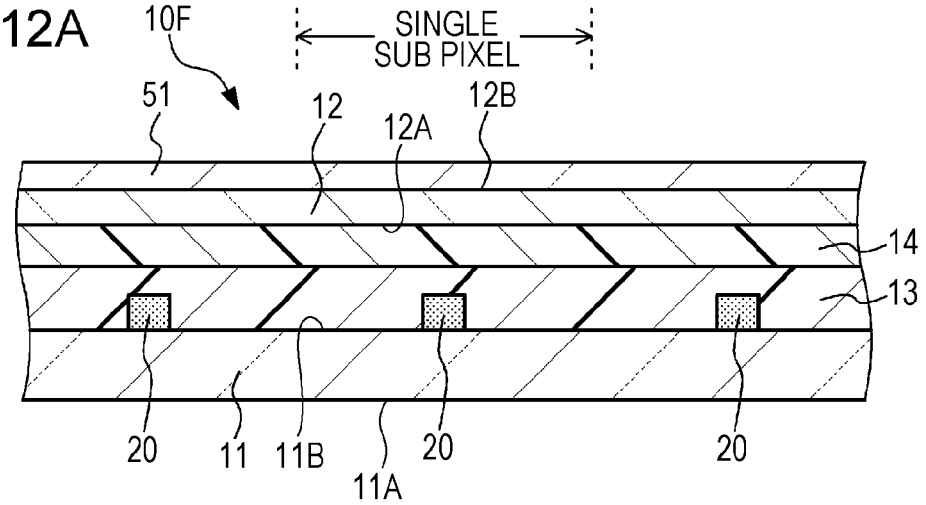
FIGS. 12A and 12B are partial schematic sectional views illustrating a display device according to a sixth example.
Figure 12B:
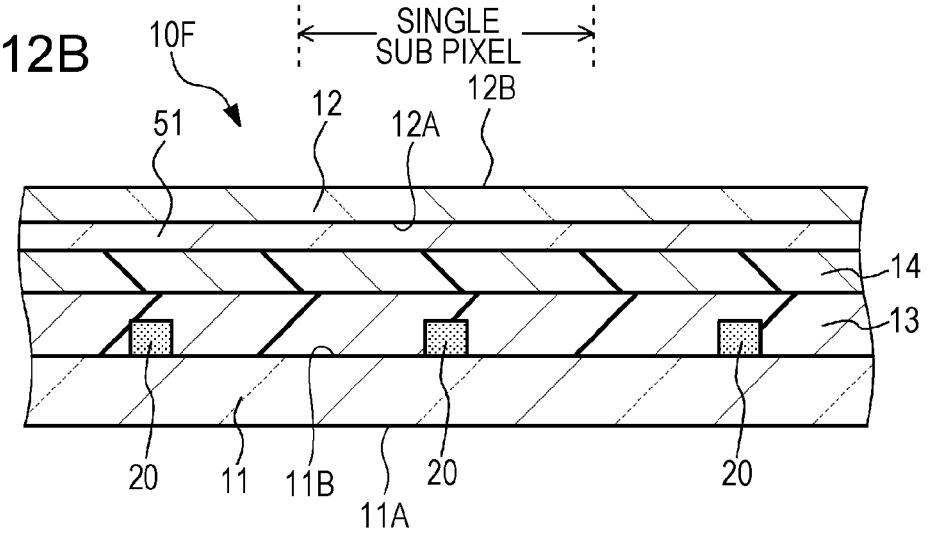
Figure 13:
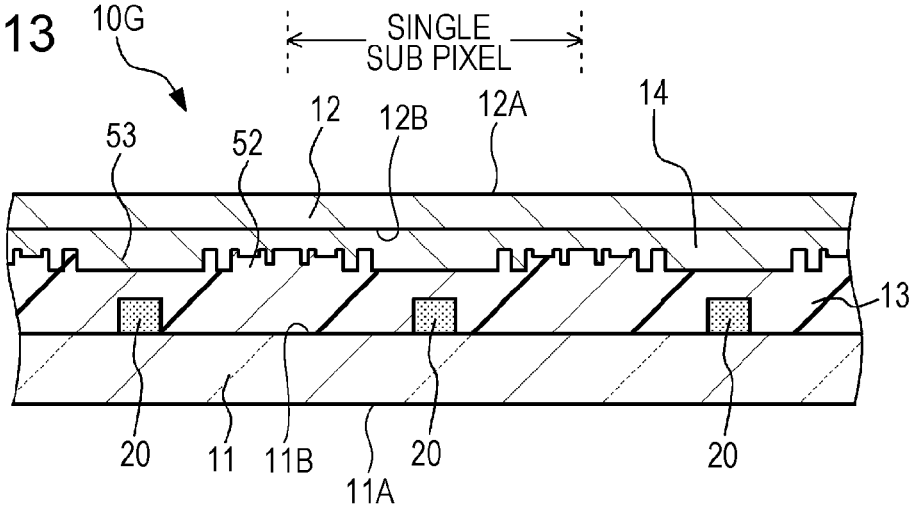
FIG. 13 is a partial schematic sectional view illustrating a display device according to a seventh example.

A fifth example is a modification of the first example to the fourth example. As shown in a conceptual diagram in FIG. 11, a display device 10E according to the fifth example is a tiling-type display device which is configured in such a way that a plurality of display devices 10A, 10B, 10C, and 10D described in the first to fourth examples are arranged as the display device units (more specifically, configured in such a way as to be arranged in a tile shape in a 2-dimensional matrix). Also, although FIG. 11 illustrates that the display devices 10A which configure the display device units are arranged with gaps therebetween, actually, the display devices 10A are arranged without gaps. Excepting for this point, the display device units which configure the display device 10E according to the fifth example each have the same configuration and structure as those of the display devices 10A, 10B, 10C, and 10D according to the first to fourth examples, and thus the detailed description thereof will not be repeated. As described above, if the display devices according to the first to fourth examples are applied, it is possible to efface tile-shaped unevenness, the joint of display device units, gaps between the display device units, light reflection, and the waviness of the display device unit. Also, different colors or patterns may be provided for the respective tiles (that is, for the respective display device units or for the respective assemblies of the display device units).

Sixth Example

A sixth example relates to the display device according to the third embodiment of the present disclosure. As shown in a conceptual diagram in FIG. 12A or 12B, a display device 10F according to the sixth example includes: a first substrate 11 that includes a first surface 11A and a second surface 11B which faces the first surface 11A; a second substrate 12 that is arranged to face the first substrate 11, and that includes a first surface 12A which faces the second surface 11B of the first substrate 11 and a second surface 12B which faces the first surface 12A; and a plurality of light emitting sections 20 that is provided on the second surface 11B of the first substrate 11 while being separated from the second substrate 12. A pattern display device 51, which is configured with a micro capsule type, an electron powder fluid type, a liquid crystal type, an electrowetting type, an electrophoresis type, a chemical change type or an electrophoresis type electronic paper or a transparent liquid crystal display device, is arranged on the second surface side (refer to FIG. 12A) or the first surface side (refer to FIG. 12B) of the second substrate 12, and displays patterns on the pattern display device 51. When the patterns are displayed on the pattern display device 51, an image is not displayed on the light emitting sections 20. On the other hand, when an image is displayed on the light emitting sections 20, the patterns are not displayed on the pattern display device 51. Since the electronic paper or the liquid crystal display device which configure the pattern display device 51 may be configured with an electronic paper or a liquid crystal display device which has existing configuration and structure, the detailed description thereof will not be repeated. A pixel formation pitch in the pattern display device 51 may be the integer multiple, the equivalent multiple, or the integer fraction of a light emitting section arrangement pitch. Also, the pattern display device 51 is conceptually illustrated.

Since it is possible to make the configurations and structures of the first substrate 11, the second substrate 12, and the light emitting sections 20 be the same as the configurations and structures of the first substrate 11, the second substrate 12, and the light emitting sections 20 of the display device described in the first example, the detailed description thereof will not be repeated.

Seventh Example

A seventh example relates to a display device according to a fourth embodiment of the present disclosure. As shown in a conceptual diagram in FIG. 13, a display device 10G according to the seventh example includes: a first substrate 11 that includes a first surface 11A and a second surface 11B which faces the first surface 11A; a second substrate 12 that is arranged to face the first substrate 11, and that includes a first surface 12A which faces the second surface 11B of the first substrate 11 and a second surface 12B which faces the first surface 12A; and a plurality of light emitting sections 20 that is provided on the second surface of the first substrate 11 while being separated from the second substrate 12. Patterns are formed on the first surface side of the second substrate 12. More specifically, the patterns are expressed by the irregularities 52 of a layer (more specifically, the protective film 13) which is positioned at the bottom of the first surface 12A of the second substrate 12. Light from the light emitting section 20 passes through the light transmission section 53, and is emitted to the outside.

Eighth Example

In an eighth example, a concept of a method of assembling a display device which is configured with a group (light emitting unit) including a first light emitting element 20R which emits red color, a second light emitting element 20G which emits green color and a third light emitting element 20B which emits blue color will be described with reference to FIGS. 14A, 14B, 14C, 14D, 15A, 15B, 16A, 16B, and 16C. However, the method of assembling the display device is not limited to a method which will be described below.

Process-800

Figure 14A:
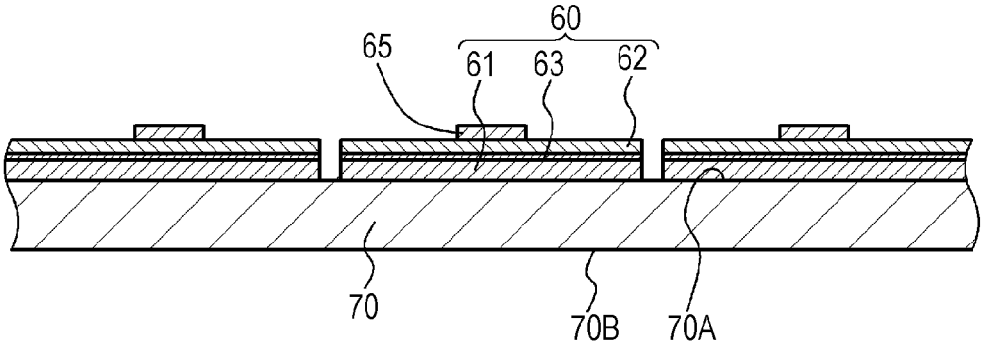
FIGS. 14A, 14B, 14C and 14D are partial schematic sectional views illustrating a light emitting element or the like in order to describe a method of assembling a display device according to an eighth example.
Figure 14B:
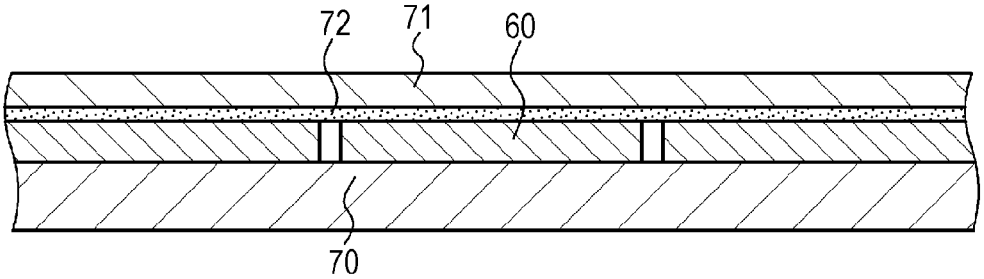
Figure 14C:
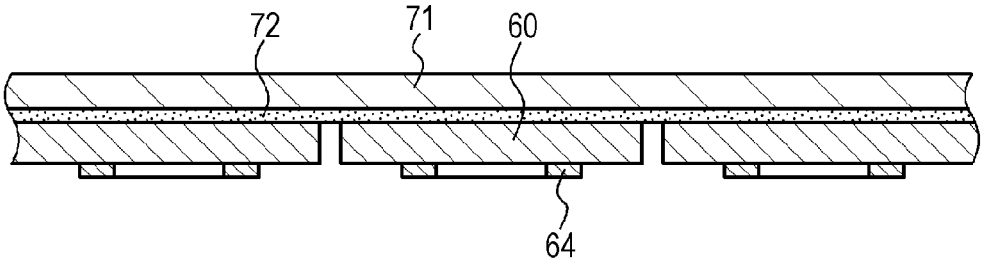

First, based on an existing method, a laminated structure 60 which includes a first compound semiconductor layer 61, an active layer 63 which is formed of a compound semiconductor and a second compound semiconductor layer 62 is formed on the first surface 70A of a substrate 70 for light emitting element manufacture based on, for example, a MOCVD method. Further, a second electrode 65 is formed on the laminated structure 60. Also, the composition, the configuration and the structure of the first compound semiconductor layer 61, the active layer 63, and the second compound semiconductor layer 62, which configure the laminated structure 60, and the second electrode 65 may be determined based on the specification which is necessary for the light emitting element. Subsequently, the second electrode 65 and the laminated structure 60 are, for example, etched or milled for element isolation. In this manner, as shown in FIG. 14A, the second electrode is formed, and thus it is possible to acquire a laminated structure 60 on which element isolation is performed. Also, in the drawings below, there is a case in which then second electrode 65 is not illustrated.

Process-810

A support substrate 71, over which an uncured adhesive layer 72 is formed, is prepared. Further, the adhesive layer 72 is hardened in such a way that the uncured adhesive layer 72 comes into contact with the second compound semiconductor layer 62 of the laminated structure 60, and thus the laminated structure 60 is bonded to the support substrate 71 (refer to FIG. 14B). Thereafter, the substrate 70 for the light emitting element manufacture is caused to be thin from a back surface 70B using a lapping method or a CMP method. When lapping is performed, the substrate 70 for the light emitting element manufacture is removed by performing etching using solution in which ammonia water is mixed with hydrogen peroxide water. Subsequently, the first electrode 64 is formed on the first compound semiconductor layer 61 using a liftoff method and a vacuum deposition method. In this way, it is possible to acquire a structure shown in FIG. 14C. Also, the element isolation may not be performed in Process-800 and the element isolation may be performed in Process-810.

Process-820

Figure 14D:
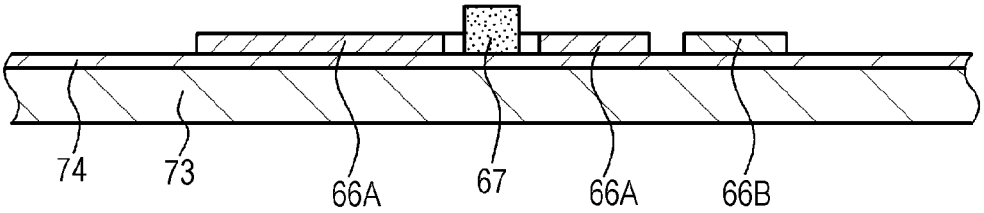
Figure 15A:
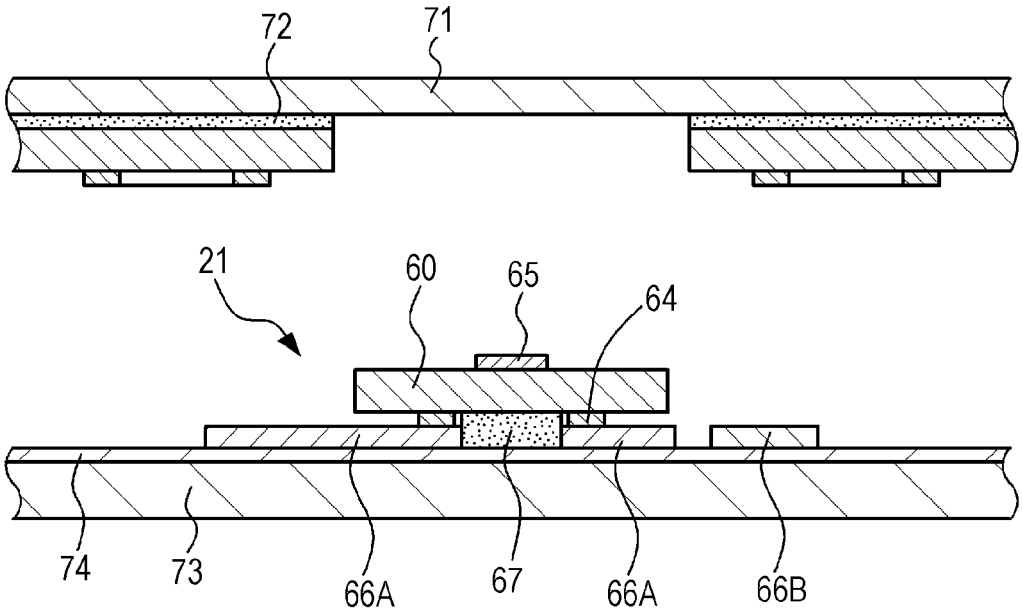
FIGS. 15A and 15B are partial schematic sectional views illustrating the light emitting element or the like in order to describe the method of assembling the display device according to the eighth example following FIG. 14D.

A pad section formation substrate 73, in which an uncured adhesive 67 is formed in a portion to fix the laminated structure 60 and a pad section 66 is formed, is prepared (refer to FIG. 14D). The pad section 66 is formed on a release layer 74 which is formed on the front surface of the pad section formation substrate 73. Further, the uncured adhesive 67 comes into contact with the laminated structure 60 (more specifically, the first compound semiconductor layer 61) and laser abrasion is generated in such a way that, for example, eximer laser radiates in the adhesive layer 72, the laminated structure 60 is removed from the support substrate 71, and thus the adhesive 67 is hardened. In this way, as shown in FIG. 15A, it is possible to acquire a structure (light emitting element chip 21) in which the laminated structure 60 is fixed on the pad section formation substrate 73 by the adhesive 67. Thereafter, the first electrode 64 is electrically connected to the first pad section 40A using a plating method.

Process-830

Figure 15B:
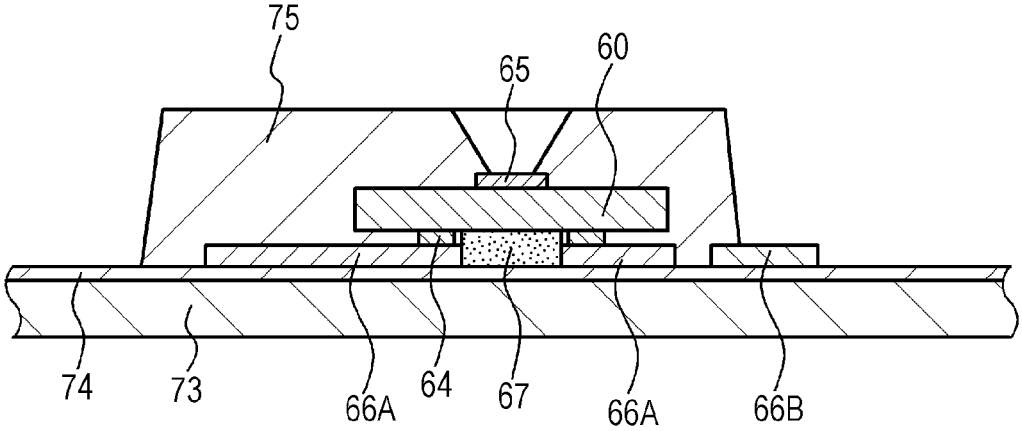

Subsequently, a sacrifice layer 75 is formed so as to extend from the laminated structure 60 to a part of the second pad section 66B (refer to FIG. 15B). The sacrifice layer 75 is not formed on a part of the second compound semiconductor layer 62 of the laminated structure 60.

Process-840

Figure 16A:
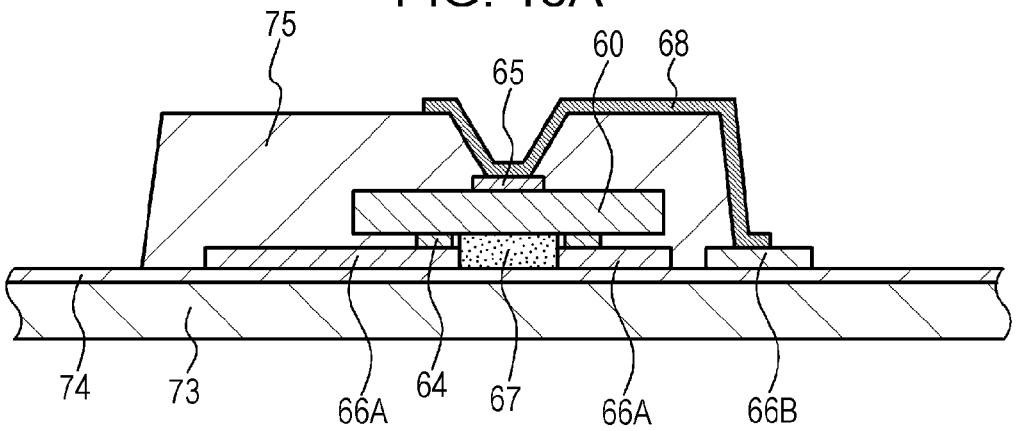
FIGS. 16A, 16B, and 16C are partial schematic sectional views illustrating the light emitting element in order to describe the method of assembling the display device according to the eighth example following FIG. 15B.
Figure 16B:
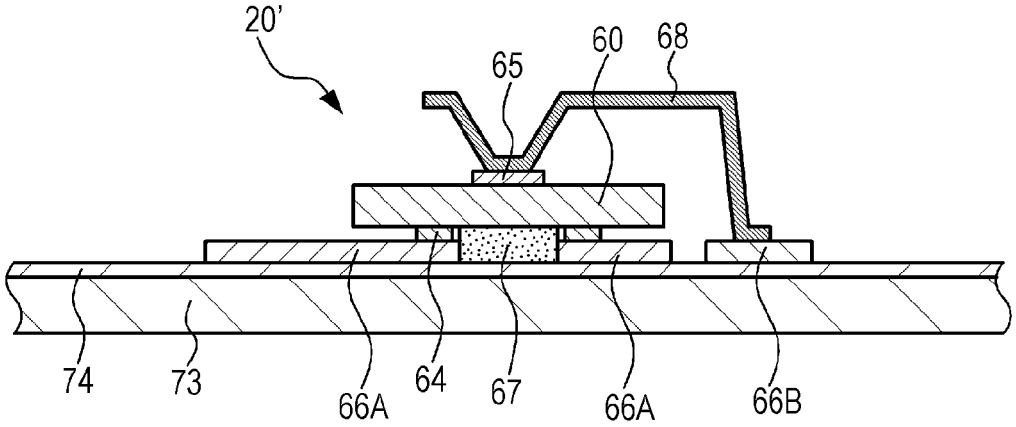

Subsequently, a wire layer 68 is formed so as to extend over the second electrode 65, the sacrifice layer 75 and the second pad section 66B (refer to FIG. 16A). The wire layer 68 is acquired by forming a ground layer and forming the wire layer 68 on the ground layer based on a plating method (more specifically, electrolysis plating method). Also, it is possible to form the wire layer 68 based on a semi-additive process. More specifically, it is possible to acquire the ground layer by sequentially forming a Titan (Ti) layer which includes a thickness of 50 nm and a copper (Cu) layer which includes a thickness of 200 nm on the entire surface thereof based on a sputtering method. Subsequently, a resist mask, which covers a region in which the wire layer 68 is not formed, is formed, and the wire layer 68, which includes a copper layer having a thickness of 2 μm, is formed on a part of the ground layer which is not covered by the resist mask based on an electrolysis plating method. Thereafter, the resist mask is removed, the ground layer is removed by performing soft etching, and the sacrifice layer 75 is removed, and thus it is possible to acquire a light emitting element 20' which includes a structure in which the second electrode 65 is connected to the second pad section 66B through the wire layer 68 (refer to FIG. 16B).

Process-850

Figure 16C:
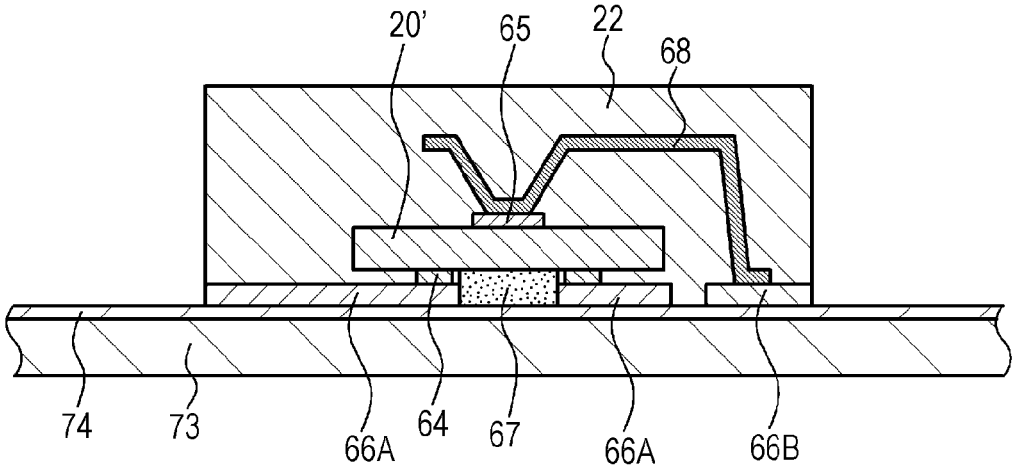

Thereafter, it is possible to acquire a molding section 22 in which the light emitting element 20' is molded by molding the light emitting element 20' using a molding material (refer to FIG. 16C).

Process-860

A relay substrate, the entire surface of which is formed with an adhesion layer, is prepared. Further, the adhesion layer comes into contact with the molding section 22, and thus the molding section 22 is adhered to the adhesion layer. Thereafter, laser abrasion is generated in such a way that eximer laser radiates in release layer 74, and the pad section formation substrate 73 is removed from the light emitting element 20'. Thereafter, the pad section 66 of the light emitting element 20' on the relay substrate is electrically connected to wiring which is provided in the first substrate 11, and the relay substrate is removed using an existing method. In this way, it is possible to acquire a structure in which the light emitting section 20 (light emitting element 20') is attached to the first substrate 11.

More specifically, the first light emitting section is transcribed from the pad section formation substrate, on which a plurality of first light emitting sections that emits red color is arranged, to a predetermined position of the relay substrate. In addition, the second light emitting section is transcribed from the pad section formation substrate, on which a plurality of second light emitting sections that emits green color is arranged, to a predetermined position of the relay substrate. Further, the third light emitting section is transcribed from the pad section formation substrate, on which a plurality of third light emitting sections that emits blue color is arranged, to a predetermined position of the relay substrate. In this way, it is possible to allocate a group (light emitting unit) including the first light emitting section, the second light emitting section and the third light emitting section in the predetermined position of the relay substrate. Further, the pad section 66 of each light emitting element 20', which configures the light emitting unit on the relay substrate, is electrically connected to the wiring which is provided on the first substrate 11, and then the relay substrate is removed using an existing method. In this way, it is possible to acquire a structure in which the light emitting sections 20 (light emitting elements 20') are attached to the first substrate 11. Also, 1 pixel is configured with a group (light emitting unit) including the first light emitting section, the second light emitting section and the third light emitting section. In addition, a sub-pixel is configured with each light emitting section. Further, a plurality of light emitting units is arranged in a 2-dimensional matrix in the first direction and the second direction which is perpendicular to the first direction.

Process-870

Thereafter, the protective film 13 is formed on the second surface side of the first substrate 11 using an existing method.

Process-880

For example, when the display device according to the first example is manufactured, the second substrate 12 on which the light transmission suppression layer 31 and the anti-reflection layer 33 are formed is prepared, and the first substrate 11 is bonded to the first surface 12A of the second substrate 12 while the adhesive layer 14 is interposed therebetween. In addition, when the display device according to the second example or the third example is manufactured, the light non-transmission section layer 34 is formed on the protective film 13, and the first surface 12A of the second substrate 12 on which the light transmission suppression layer 31 is formed is bonded to the first substrate 11 while the adhesive layer 14 is interposed therebetween. Otherwise, when the display device according to the second example or the third example is manufactured, the first surface 12A of the second substrate 12, in which the light transmission suppression layer 31 is formed on the second surface 12B and the light non-transmission section layer 34 is formed on the first surface 12A, is bonded to the first substrate 11 while the adhesive layer 14 is interposed therebetween.

Hereinbefore, although the present disclosure has been described based on the preferred examples, the present disclosure is not limited to the examples. The configurations and structures of the display device, the light emitting section, and the light emitting element type-display device built with the light emitting section, which are described in the examples, are examples. The members and the materials thereof are examples, and can be appropriately changed.

A fourth light emitting section and a fifth light emitting section may be added to the first light emitting section, the second light emitting section, and the third light emitting section as the light emitting sections which configure the light emitting unit. Sub-pixels are configured with the light emitting sections, and 1 pixel is configured with the light emitting unit. As such an example, it is possible to exemplify, for example, a light emitting unit to which a sub-pixel that emits white light is added in order to improve brightness, a light emitting unit to which a sub-pixel that emits a complementary color is added in order to extend a color range, a light emitting unit to which a sub-pixel that emits a yellow color is added in order to extend a color range, and a light emitting unit to which sub-pixels that emit a yellow color and a cyan color are added in order to extend a color range. When the light emitting section is configured with four or more light emitting elements, a circle, which includes all the light emitting elements, is assumed, and the diameter of the circle may be $D_0$. Otherwise, when the light emitting section is configured with four or more light emitting elements, and the light emitting elements are not disposed on a straight line, a circle, which connects the centers of three light emitting elements positioned on the outermost side in the light emitting section, is assumed, and the diameter of the circle may be $D_0$.

Figure 17A:
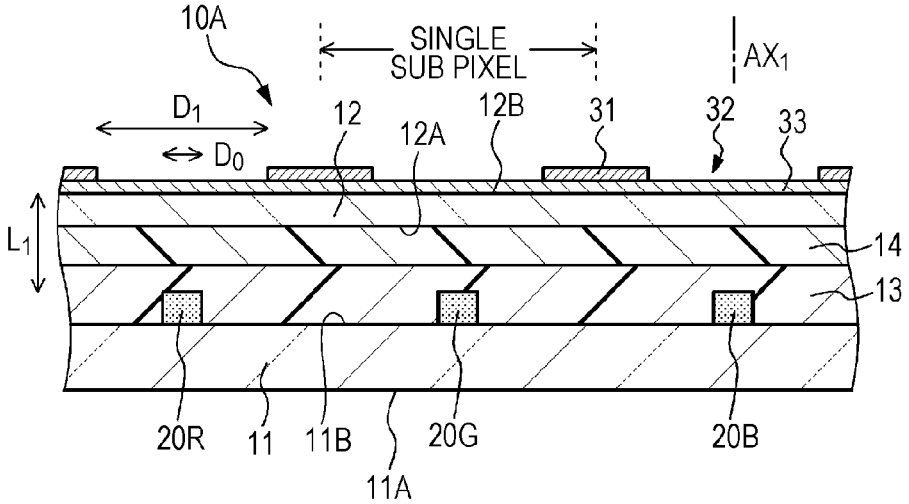
FIGS. 17A and 17B are a partial schematic sectional view and a partial schematic plan view illustrating another modification example of the display device according to the first example.
Figure 17B:
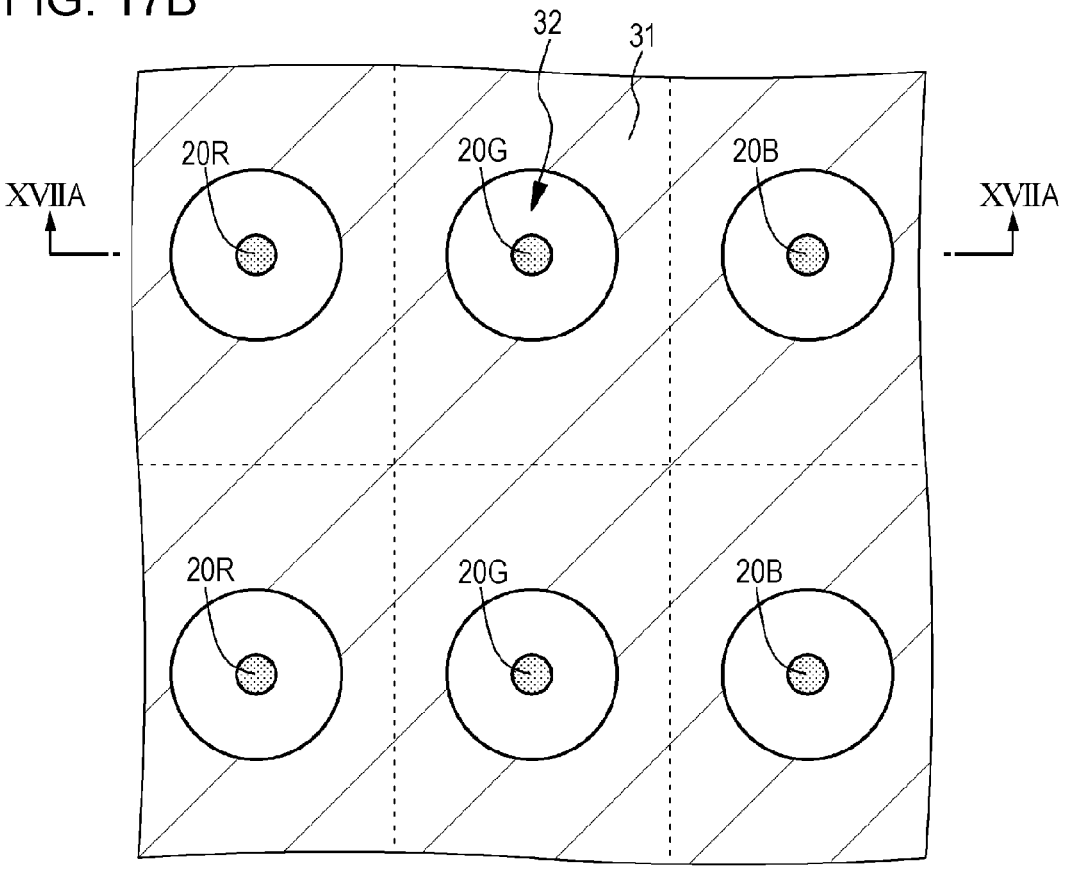
Figure 18A:
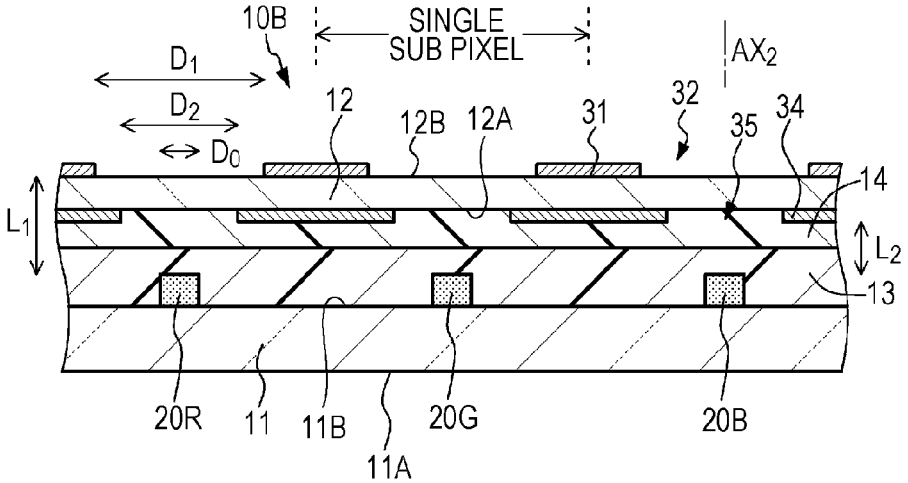
FIGS. 18A and 18B are a partial schematic sectional view and a partial schematic plan view illustrating another modification example of the display device according to the second example.
Figure 18B:
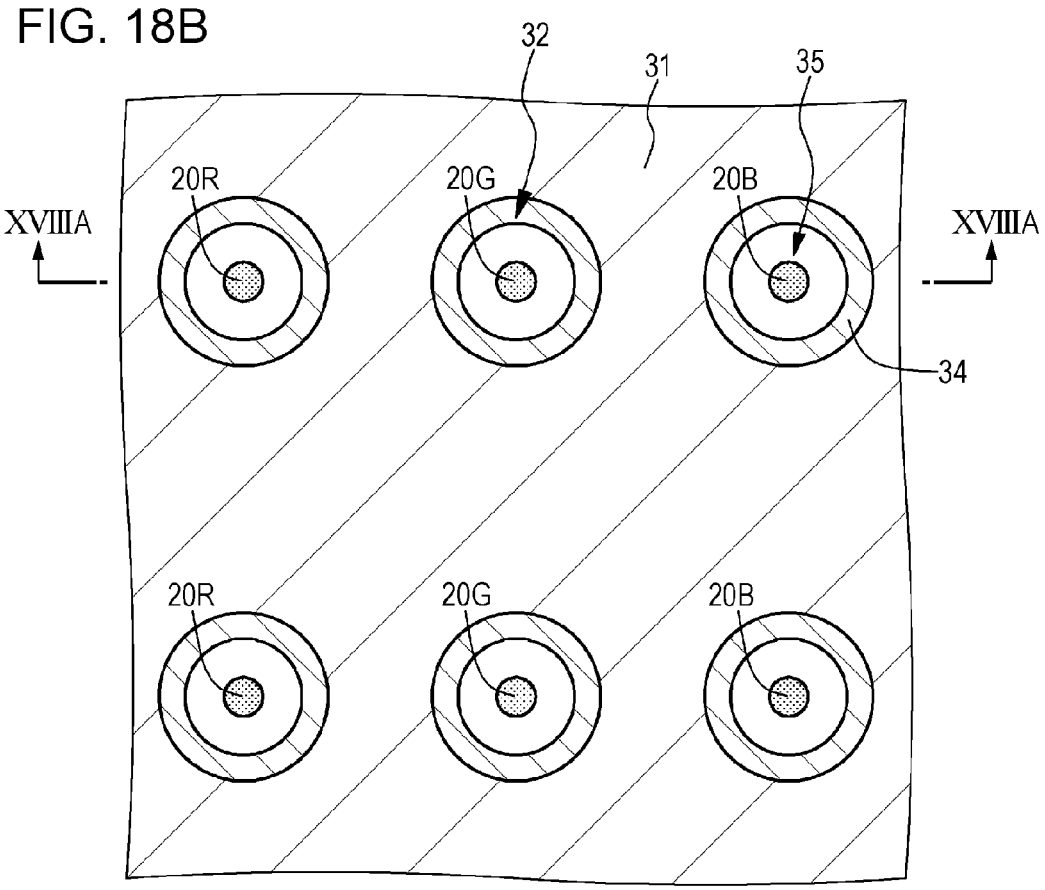

The modification example of the display device according to the first example shown in FIGS. 1A and 1B is shown in FIGS. 17A and 17B, the modification example of the display device according to the second example shown in FIGS. 3A and 3B is shown in FIGS. 18A and 18B. In the modification examples, a single light emitting section is configured with a single light emitting element. Also, it is possible to apply such a configuration to the third to eight examples.

Figure 19:
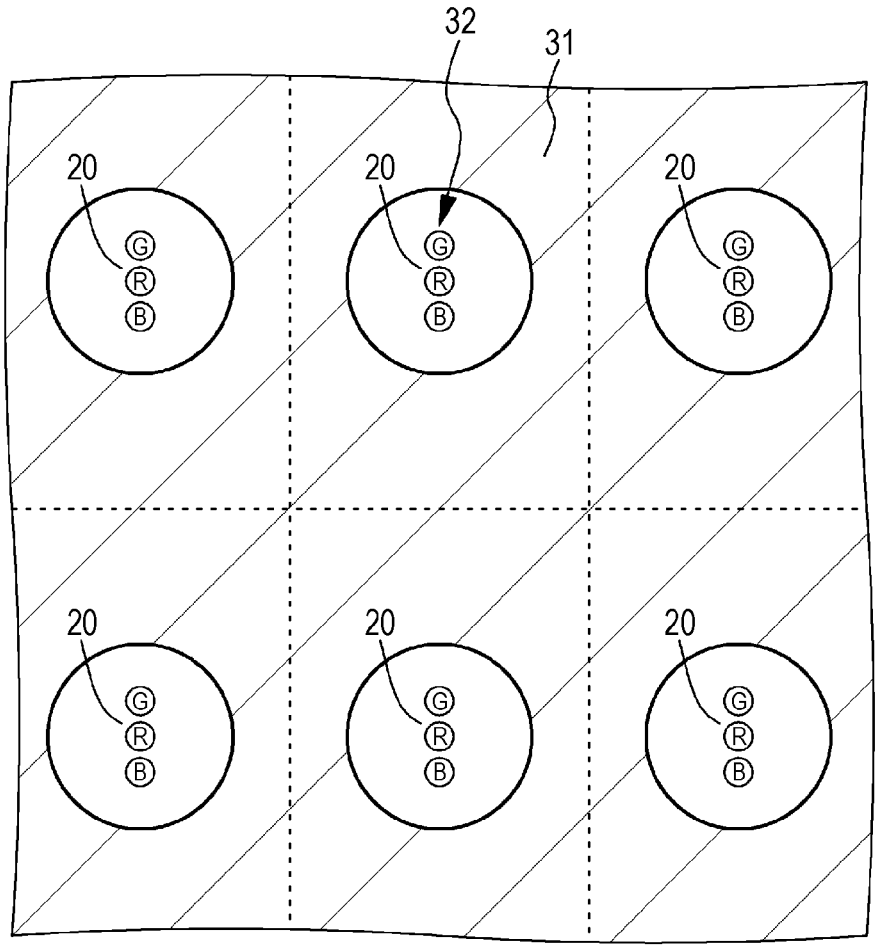
FIG. 19 is a partial schematic plan view illustrating a modification example of the display device according to the first example.
Figure 20:
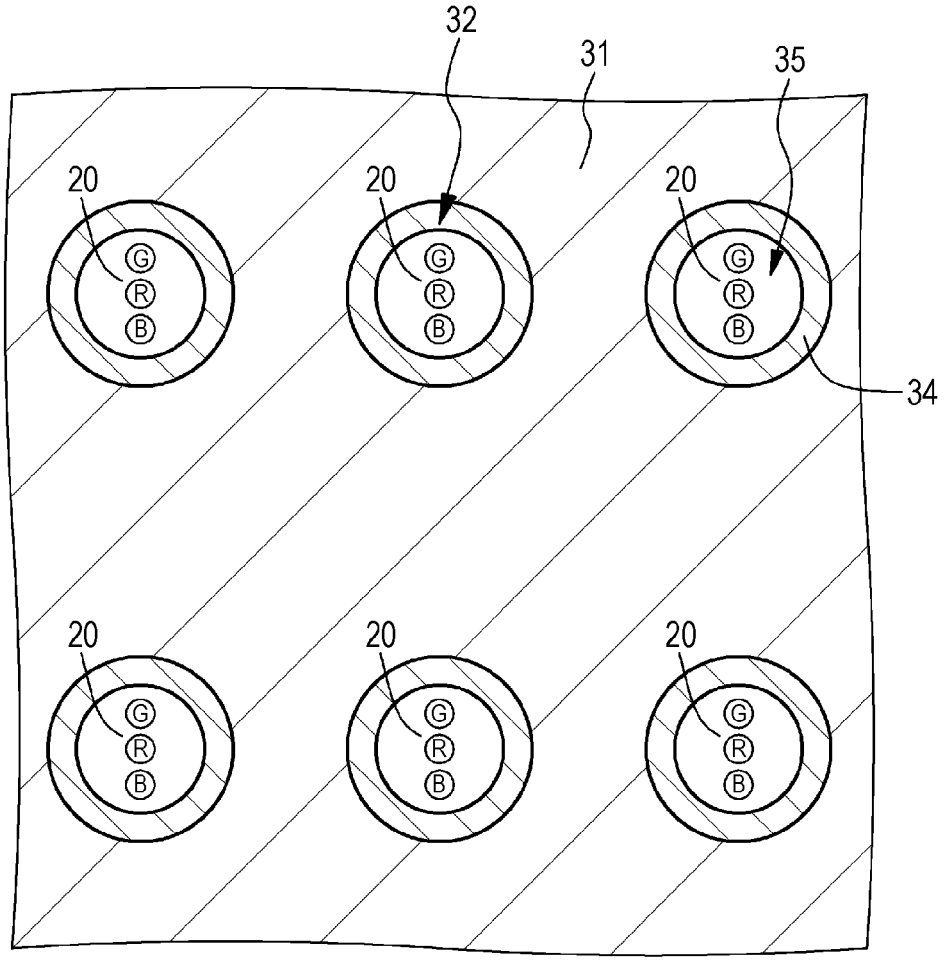
FIG. 20 is a partial schematic plan view illustrating a modification example of the display device according to the second example.
Figure 21:
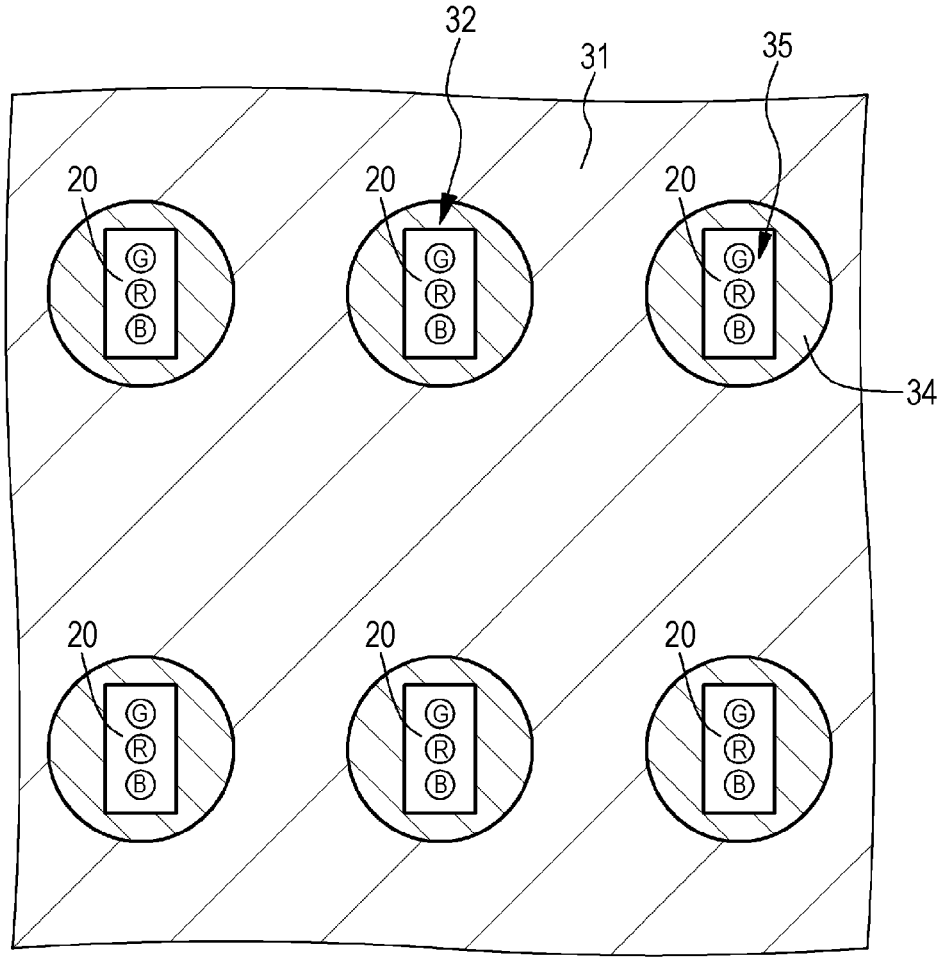
FIG. 21 is a partial schematic plan view illustrating another modification example of the display device according to the second example.

Further, in the examples, the centers of the respective light emitting elements 20R, 20G, and 20B are arranged on the circumference of a circle, but the arrangement of the respective light emitting elements 20R, 20G, and 20B is not limited thereto. For example, the modification example of the arrangement of the respective light emitting elements 20R, 20G, and 20B in the display device according to the first example is shown in FIG. 19, and the modification examples of the arrangement of the respective light emitting elements 20R, 20G, and 20B in the display device according to the second example are shown in FIGS. 20 and 21. Also, in FIG. 21, the planar shape of the second light transmission section 35 is a rectangle. In the modification examples, the centers of the respective light emitting elements 20R, 20G, and 20B are arranged in a straight line. Further, in the cases, a circle, which includes all the light emitting elements, is assumed, and the diameter of the circle may be $D_0$. Otherwise, a line segment, which connects the centers of two light emitting elements 20G and 20B positioned on the outermost side, is assumed, and the diameter of the circle whose diameter is the line segment may be $D_0$.

When the display device operates, that is, when the light emitting section operates (when the light emitting section is turned on), images which cancel patterns may be overlapped with each other. When some processes are not performed, the brightness of a display image in the light emitting section and brightness which accompanies with the patterns are recognized, and an image in which patterns are overlapped is recognized. Here, when an image from which brightness corresponding to the brightness of patterns (for convenience, referred to as "brightness after signal processing") is subtracted from an original display image is displayed, that is, when a signal corresponding to the brightness of a pattern is subtracted from a signal used to display the original display image, (brightness of original image display)+(brightness accompanying with pattern)−(brightness after signal processing)=(brightness of original image display). Therefore, when the light emitting section operates (when the light emitting section is turned on), it is possible to cancel patterns. It is possible to perform such a signal processing based on an existing signal processing, and it is possible to use an existing signal processing circuit as a signal processing circuit. Also, actually, there is a case in which brightness accompanying with patterns differs depending on illumination or light from outside. Therefore, when the brightness of the patterns is subtracted from the original display image, there is a case in which it is necessary to multiply a coefficient which depends on an environment in which the display device is installed, by "brightness acquired after processing".

Also, the present disclosure can include structures as below.

[A01] Display Device

First Embodiment

A display device including: a first substrate that includes a first surface and a second surface which faces the first surface; a second substrate that is arranged to face the first substrate, and that is configured with a first surface which faces the second surface of the first substrate, and a second surface which faces the first surface; and a plurality of light emitting sections that is provided on the second surface of the first substrate while being separated from the second substrate. A light transmission suppression layer on which a light transmission section to transmit light from light emitting sections is provided is formed on the second surface of the second substrate in correspondence to each light emitting section, and an anti-reflection layer is formed in the light transmission section.

[A02] In the display device of [A01], the light transmission suppression layer includes an anti-reflection function.

[A03] In the display device of [A01] or [A02], the light transmission suppression layer includes specular reflectance at the same level as the specular reflectance of the anti-reflection layer.

[A04] In the display device of any one of [A01] to [A03], the anti-reflection layer extends between the light transmission suppression layer and the second surface of the second substrate.

[A05] In the display device of any one of [A01] to [A03], the anti-reflection layer covers the light transmission suppression layer.

[A06] In the display device of [A01], patterns are attached to the light transmission suppression layer.

[A07] In the display device of [A06], a pattern formation pitch is an integer multiple, an equivalent multiple, or an integer fraction of a light emitting section arrangement pitch.

[A08] In the display device of any one of [A01] to [A07], a thickness of the light transmission suppression layer becomes thin as being close to the light transmission section.

[A09] In the display device of any one of [A01] to [A08], when it is assumed that an external shape of the light transmission section is a circle which has a diameter $D_1$, that the light emitting section is a circle which has a diameter $D_0$, that a distance from a top face of the light emitting section to the light transmission section is $L_1$, and that an average refractive index of a light path from the light emitting section to the light transmission suppression layer provided with the light transmission section is $n_1$, $\tan(\sin^{-1}(1/n_1)) \leq (D_1-D_0)/(2\cdot L_1) \leq 2$ is satisfied.

[A10] In the display device of [A09], the center of the light emitting section and the center of the light transmission section are on the same axis line.

[A11] In the display device of any one of [A01] to [A10], a light non-transmission section layer, provided with a second light transmission section which transmits light from the light emitting section, is formed on the first surface side of the second substrate in correspondence to each light emitting section, and an area of the second light transmission section is smaller than an area of the light transmission section.

[A12] In the display device of [A11], when it is assumed that an external shape of the second light transmission section is a circle which has a diameter $D_2$, that the light emitting section is a circle which has a diameter $D_0$, that a distance from a top face of the light emitting section to the second light transmission section is $L_2$, and that an average refractive index of a light path from the light emitting section to the non-transmission section layer provided with the second light transmission section is $n_2$, $\tan(\sin^{-1}(1/n_2)) \leq (D_2-D_0)/(2\cdot L_2) \leq 2$ is satisfied.

[A13] In the display device of [A12], the center of the light emitting section, the center of the light transmission section and the center of the second light transmission section are on the same axis line, and the light transmission section has a figure which is similar to the figure of the second light transmission section.

[B01] Display Device

Second Embodiment

A display device including: a first substrate that includes a first surface and a second surface which faces the first surface; a second substrate that is arranged to face the first substrate, and that is configured with a first surface which faces the second surface of the first substrate, and a second surface which faces the first surface; and a plurality of light emitting sections that is provided on the second surface of the first substrate while being separated from the second substrate. A light transmission suppression layer, provided with a first light transmission section which transmits light from light emitting sections, is formed on the second surface of the second substrate in correspondence to each light emitting section, and a light non-transmission section layer, provided with a second light transmission section which transmits light from the light emitting section, is formed on the first surface side of the second substrate, and an area of the second light transmission section is smaller than an area of the first transmission section.

[B02] In the display device of [B01], the light transmission suppression layer includes an anti-reflection function.

[B03] In the display device of [B01], patterns are attached to the light transmission suppression layer.

[B04] In the display device of [B03], a pattern formation pitch is an integer multiple, an equivalent multiple, or an integer fraction of a light emitting, section arrangement pitch.

[B05] In the display device of any one of [B01] to [B04], a thickness of the light transmission suppression layer becomes thin as being close to the first light transmission section.

[B06] In the display device of any one of [B01] to [B05], when it is assumed that an external shape of the first light transmission section is a circle which has a diameter $D_1$, that, the light emitting section is a circle which has a diameter $D_0$, that a distance from a top face of the light emitting section to the first light transmission section is $L_1$, and that an average refractive index of a light path from the light emitting section to the light transmission suppression layer provided with the light transmission section is $n_1$, $\tan(\sin^{-1}(1/n_1)) \leq (D_1-D_0)/(2\cdot L_1) \leq 2$ is satisfied.

[B07] In the display device of [B06], when it is assumed that an external shape of the second light transmission section is a circle which has a diameter $D_2$, that the light emitting section is a circle which has a diameter $D_0$, that a distance from a top face of the light emitting section to the second light transmission section is $L_2$, and that an average refractive index of a light path from the light emitting section to the light non-transmission section layer provided with the second light transmission section is $n_2$, $\tan(\sin^{-1}(1/n_2)) \leq (D_2-D_0)/(2\cdot L_2) \leq 2$ is satisfied.

[B08] In the display device of [B06] or [B07], the center of the light emitting section, the center of the first light transmission section and the center of the second light transmission section are on the same axis line, and the first light transmission section has a figure which is similar to the figure of the second light transmission section.

[B09] A display device including: a first substrate that includes a first surface and a second surface which faces the first surface; a second substrate that is arranged to face the first substrate, and that is configured with a first surface which faces the second surface of the first substrate, and a second surface which faces the first surface; and a plurality of light emitting sections that is provided on the second surface of the first substrate while being separated from the second substrate. A pattern display device is arranged on the second surface or the first surface side of the second substrate side, and patterns are displayed on the pattern display device.

[B10] In the display device of [B09], the pattern display device includes an electronic paper or a transparent liquid crystal display device.

[B11] In the display device of [B09] or [B10], an image is not displayed in the light emitting section when patterns are displayed on the pattern display device, and patterns are not displayed on the patter display device when an image is displayed in the light emitting section.

[B12] A display device including: a first substrate that includes a first surface and a second surface which faces the first surface; a second substrate that is arranged to face the first substrate, and that is configured with a first surface which faces the second surface of the first substrate, and a second surface which faces the first surface; and a plurality of light emitting sections that is provided on the second surface of the first substrate while being separated from the second substrate. Patterns are formed on the first surface side of the second substrate.

[B13] In the display device of [B12], the patterns are expressed by irregularities of a layer which is positioned at the bottom of the first surface of the second substrate.

[C01] In the display device of any one of [A01] to [B13], the light emitting section includes a light emitting diode.

[C02] In the display device of any one of [A01] to [B13], each of the light emitting sections is configured with a plurality of the light emitting diodes which are arranged in a straight line.

[C03] A tiling-type display device in which a plurality of display devices of any one of [A01] to [C02] is arranged.

[C04] In the tiling-type display device of [C03] in which different colors or patterns are provided for respective tiles.

It should be understood by those skilled in the art that various modifications, combinations, sub-combinations and alterations may occur depending on design requirements and other factors insofar as they are within the scope of the appended claims or the equivalents thereof.

What is claimed is:

1. A display device, comprising:

a first substrate that includes a first surface and a second surface;

a second substrate on the first substrate, the second substrate having [(a)] a first surface which faces the second surface of the first substrate, and [(b)] a second surface which faces away from the first surface of the second substrate; and a plurality of light emitting sections on the second surface of the first substrate[,];

a light transmission suppression layer on the second surface of the second substrate[,];

a light non-transmission section layer on the first surface of the second substrate[,]; and an anti-reflection layer on the second surface of the second substrate, wherein[,]

the light transmission suppression layer has a first light transmission section that transmits light from a corresponding light emitting section of the plurality of light emitting sections,

*the light transmission suppression layer tapers in thickness as the light transmission suppression layer approaches the first light transmission section,* the light non-transmission section layer has a second light transmission section that transmits light from the corresponding light emitting section, the second light transmission section is between the first light transmission section and the corresponding light emitting section, and an area of the second light transmission section is different in size than an area of the first light transmission section.

2. The display device according to claim 1, wherein the light transmission suppression layer includes an anti-reflection function.

3. The display device according to claim 1, wherein the anti-reflection layer is between the light transmission suppression layer and the second substrate.

4. The display device according to claim 1, wherein the anti-reflection layer covers the light transmission suppression layer.

5. The display device according to claim 1, wherein the light transmission suppression layer includes patterns.

6. The display device according to claim 5, wherein a pattern formation pitch of the patterns is *one of* an integer multiple, an equivalent multiple, or an integer fraction of a light emitting section arrangement pitch of the plurality of light emitting sections.

[7. The display device according to claim 1, wherein the light transmission suppression layer tapers in thickness as the light transmission layer approaches the light transmission section.]

8. The display device according to clam 1, wherein a relationship of $\tan(\sin^{-1}(1/n_1))\leq(D_1-D_0)/(2L_1)\leq 2$ is satisfied when (a) a shape of the first light transmission section in plan view is a circle with a diameter $D_1$, (b) a shape of [the] *a* light emitting section *of the plurality of light emitting sections* in plan view is a circle with a diameter $D_0$, (c) a distance from a top face of the light emitting section to the *first* light transmission section is $L_1$, and (d) an average refractive index of a light path from the light emitting section to the light transmission suppression layer provided with the *first* light transmission section is $n_1$.

9. The display device according to claim 1, wherein the area of the second light transmission section is smaller than the area of the first light transmission section.

10. The display device according to claim 9, wherein a relationship of $\tan(\sin^{-1}(1/n_1))\leq(D_2-D_0)/(2L_2)\leq 2$ is satisfied when (a) a shape of the second light transmission section in plan view is a circle with a diameter $D_2$, (b) a shape of [the] *a* light emitting section *of the plurality of light emitting sections* in plan view is a circle with a diameter $D_0$, (c) a distance from a top face of the light emitting section to the second light transmission section is $L_2$, and (d) an average refractive index of a light path from the light emitting section to the light non-transmission section layer provided with the second light transmission section is $n_2$.

11. A display device, comprising:

a first substrate that includes a first surface and a second surface;

a second substrate having [(a)] a first surface which faces the second surface of the first substrate, and [(b)] a second surface which is opposite to the first surface of the second substrate; and a plurality of light emitting sections on the second surface of the first substrate, wherein[,]

a light transmission suppression layer, provided with a first light transmission section which transmits light from *the plurality of* light emitting sections, is on the second surface of the second substrate in correspondence to each light emitting section, [and]

*the light transmission suppression layer tapers in thickness as the light transmission suppression layer approaches the first light transmission section,* a light non-transmission section layer, provided with a second light transmission section which transmits light from [the] *a* light emitting section *of the plurality of light emitting sections*, is on the first surface of the second substrate, and an area of the second light transmission section is smaller than an area of the first light transmission section.

12. The display device according to claim 11, wherein the light transmission suppression layer includes an anti-reflection function.

13. The display device according to claim 11, wherein light transmission suppression layer includes patterns.

14. The display device according to claim 13, wherein a pattern formation pitch of the patterns is *one of* an integer multiple, an equivalent multiple, or an integer fraction of a light emitting section arrangement pitch of the plurality of light emitting sections.

[15. The display device according to claim 11, wherein the light transmission suppression layer tapers in thickness as the light transmission layer approaches the first light transmission section.]

16. The display device according to claim 11, wherein a relationship of $\tan(\sin^{-1}(1/n_1))\leq(D_1-D_0)/(2L_1)\leq 2$ is satisfied when (a) a shape of the first light transmission section in plan view is a circle with a diameter $D_1$, (b) a shape of the light emitting section *of the plurality of light emitting sections* in plan view is a circle with a diameter $D_0$, (c) a distance from a top face of the light emitting section to the first light transmission section is $L_1$, and (d) an average refractive index of a light path from the light emitting section to the light transmission suppression layer provided with the *first* light transmission section is $n_1$.

17. The display device according to claim 16, wherein a relationship of $\tan(\sin^{-1}(1/n_2))\leq(D_2-D_0)/(2L_2)\leq 2$ is satisfied when (a) a shape of the second light transmission section in plan view is a circle with a diameter $D_2$, (b) [a] *the* shape of [the-light] *the light* emitting section in plan view is [a] *the* circle with [a] *the* diameter $D_0$, (c) a distance from [a] *the* top face of the light emitting section to the second light transmission section is $L_2$, and (d) an average refractive index of a light path from the light emitting section to the light non-transmission section layer provided with the second light transmission section is $n_2$.

18. The display device according to claim 1, wherein each of the plurality of light emitting sections comprises a light emitting diode.

19. The display device according to claim 18, wherein each of the plurality of light emitting sections comprises a plurality of [the] light emitting diodes which are arranged in a straight line.

20. A tiling-type display device, comprising*:* a plurality of [the] display devices *including the display device* according to claim 1.

21. The tiling-type display device according to claim 20, wherein[:] the plurality of display devices are disposed in a tile arrangement comprising a matrix in which each display device *of the plurality of display devices* represents a tile in the tile arrangement, and the plurality of display devices [include] *includes* a plurality of colors or patterns.

*22. A display device, comprising:*

*a first substrate;*

*a plurality of light emitting sections on a surface of the first substrate;*

*a protective layer over the plurality of the light emitting sections;*

*a light non-transmission section layer on a first surface of a second substrate of the display device, wherein*

*the second substrate is on the first substrate, and*

*the light non-transmission section layer has a first light transmission section configured to transmit light from a corresponding light emitting section of the plurality of light emitting sections;*

*a light transmission suppression layer over a portion of the protective layer, wherein*

*the light transmission suppression layer has a second light transmission section configured to transmit the light from the corresponding light emitting section, and*

*the light transmission suppression layer tapers in thickness as the light transmission suppression layer approaches the second light transmission section; and*

*an anti-reflection layer between the light transmission suppression layer and the light non-transmission section layer, wherein*

*the anti-reflection layer is on a second surface of the second substrate, and*

*the second surface of the second substrate is opposite to the first surface of the second substrate.*

*23. The display device according to claim 22, wherein an area of the light transmission suppression layer is different in size from an area acquired based on projection of the corresponding light emitting section onto the second surface of the second substrate.*

*24. The display device according to claim 22, wherein the light transmission suppression layer includes an anti-reflection function.*

*25. The display device according to claim 22, wherein the light transmission suppression layer includes patterns.*

*26. The display device according to claim 25, wherein a pattern formation pitch of the patterns is one of an integer multiple, an equivalent multiple, or an integer fraction of an arrangement pitch of the corresponding light emitting section.*

*27. The display device according to claim 22, further comprising an adhesive layer on the protective layer.*

*28. The display device according to claim 22, wherein first light transmission section is on the protective layer.*

*29. The display device according to claim 28, wherein the second light transmission section is on the first light transmission section.*

*30. The display device according to claim 29, wherein an area of the first light transmission section is smaller than an area of the second light transmission section.*

* * * * *